(12) United States Patent
Ryu et al.

(10) Patent No.: US 9,583,402 B2
(45) Date of Patent: Feb. 28, 2017

(54) METHOD OF MANUFACTURING A SEMICONDUCTOR DEVICE USING SEMICONDUCTOR MEASUREMENT SYSTEM

(71) Applicant: Samsung Electronics Co., Ltd., Suwon-si (KR)

(72) Inventors: Sung Yoon Ryu, Hwaseong-si (KR); Wooseok Ko, Seoul (KR); Souk Kim, Seoul (KR); Yusin Yang, Seoul (KR); Sangkil Lee, Yongin-si (KR); Chungsam Jun, Suwon-si (KR); Kwanwoo Ryu, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/794,813

(22) Filed: Jul. 9, 2015

(65) Prior Publication Data
US 2016/0027707 A1 Jan. 28, 2016

(30) Foreign Application Priority Data
Jul. 28, 2014 (KR) ........................ 10-2014-0095944

(51) Int. Cl.
*H01L 21/66* (2006.01)
*H01L 21/67* (2006.01)

(52) U.S. Cl.
CPC ........ *H01L 22/12* (2013.01); *H01L 21/67173* (2013.01); *H01L 22/20* (2013.01)

(58) Field of Classification Search
CPC .... H01L 22/12; H01L 22/26; H01L 21/67173
See application file for complete search history.

(56) References Cited

U.S. PATENT DOCUMENTS

| 6,888,639 | B2 | 5/2005 | Goebel et al. |
| 7,057,741 | B1 * | 6/2006 | Mueller ................ G01B 11/06 356/512 |
| 7,084,979 | B1 | 8/2006 | Aiyer |
| 7,528,940 | B2 | 5/2009 | Veis et al. |
| 7,582,183 | B2 | 9/2009 | Tang |
| 8,111,390 | B2 | 2/2012 | Tsai et al. |
| 2004/0173599 | A1 * | 9/2004 | Velichko ........... H01L 21/67248 219/494 |
| 2004/0235205 | A1 * | 11/2004 | Levy .................... G01N 21/211 438/14 |

(Continued)

FOREIGN PATENT DOCUMENTS

| KR | 10-2007-0110390 A | 11/2007 |
| KR | 10-2013-0111555 A | 10/2013 |

*Primary Examiner* — Joseph C Nicely
(74) *Attorney, Agent, or Firm* — Muir Patent Law, PLLC

(57) ABSTRACT

A method includes loading a substrate into a sensing chamber; while the substrate is in the sensing chamber, performing a spectral analysis of the substrate; transferring the substrate between the sensing chamber and a processing chamber coupled to the sensing chamber; processing the substrate in the processing chamber to form at least a first layer and/or pattern on the substrate; and based on at least the spectral analysis, determining whether a parameter resulting from the formation of first layer and/or pattern is satisfied.

19 Claims, 16 Drawing Sheets

(56) References Cited

U.S. PATENT DOCUMENTS

| | | | |
|---|---|---|---|
| 2005/0095730 A1* | 5/2005 | Mikami | G01B 11/0683 438/16 |
| 2005/0114070 A1* | 5/2005 | Dozoretz | G01L 13/00 702/140 |
| 2005/0118808 A1* | 6/2005 | Liu | H01L 21/7684 438/687 |
| 2005/0206911 A1* | 9/2005 | Kono | G01B 11/0641 356/630 |
| 2006/0285120 A1 | 12/2006 | Aiyer | |
| 2007/0046927 A1* | 3/2007 | Le | C23C 14/54 356/73 |
| 2007/0134821 A1* | 6/2007 | Thakur | C23C 16/45546 438/5 |
| 2007/0196011 A1* | 8/2007 | Cox | G01N 21/33 382/145 |
| 2008/0098957 A1* | 5/2008 | Ryu | C23C 14/568 118/712 |
| 2008/0116077 A1* | 5/2008 | Sricharoenchaikit | C25D 3/60 205/148 |
| 2009/0088887 A1* | 4/2009 | Chen | H01L 21/681 700/114 |
| 2009/0219499 A1* | 9/2009 | Yamaguchi | G01B 11/0608 355/67 |
| 2010/0097607 A1* | 4/2010 | Susaki | G01B 11/0641 356/369 |
| 2010/0166945 A1* | 7/2010 | Lee | C23C 16/52 427/10 |
| 2010/0247809 A1* | 9/2010 | Neal | C23C 14/30 427/596 |
| 2010/0332013 A1* | 12/2010 | Choi | G05B 23/0254 700/110 |
| 2011/0217467 A1* | 9/2011 | Sahase | B05C 11/00 427/255.7 |
| 2012/0118224 A1 | 5/2012 | Bour et al. | |
| 2012/0129431 A1* | 5/2012 | Hui | B24B 37/005 451/5 |
| 2012/0242995 A1* | 9/2012 | Konno | G01N 21/9501 356/450 |
| 2012/0272892 A1* | 11/2012 | Paranjpe | C30B 25/10 117/86 |
| 2013/0156940 A1* | 6/2013 | Wu | C23C 16/52 427/9 |
| 2013/0319612 A1* | 12/2013 | Su | H01J 37/32449 156/345.24 |
| 2014/0039822 A1 | 2/2014 | Logothetidis | |
| 2014/0367267 A1* | 12/2014 | Egan | G01B 7/105 205/84 |
| 2015/0087082 A1* | 3/2015 | Iyer | B23K 26/0075 438/5 |
| 2015/0140805 A1* | 5/2015 | Parikh | H01L 21/76802 438/627 |
| 2015/0170978 A1* | 6/2015 | Chen | H01L 22/12 438/8 |
| 2015/0331331 A1* | 11/2015 | Sentoku | G03F 7/70191 355/67 |
| 2016/0153915 A1* | 6/2016 | Ko | G01N 21/8806 356/369 |
| 2016/0155650 A1* | 6/2016 | Ho | H01L 21/565 438/126 |

\* cited by examiner

METHOD OF MANUFACTURING A SEMICONDUCTOR DEVICE USING SEMICONDUCTOR MEASUREMENT SYSTEM

CROSS-REFERENCE TO RELATED APPLICATION

This U.S. non-provisional patent application claims priority under 35 U.S.C. §119 to Korean Patent Application No. 10-2014-0095944, filed on Jul. 28, 2014, in the Korean Intellectual Property Office, the disclosure of which is hereby incorporated by reference in its entirety.

BACKGROUND

The present disclosure relates to a method of manufacturing a semiconductor device using a semiconductor measurement system, and methods of measuring a semiconductor device using the same.

Semiconductor devices are widely used in an electronic industry because of their small size, multi-function, and/or low fabricating costs. Semiconductor devices may be fabricated by various fabricating processes such as photolithography processes, etching processes, deposition processes, ion implantation processes, and cleaning processes.

After one or more of the fabricating processes of semiconductor devices are performed, measuring processes may be performed to determine whether patterns of the semiconductor devices are good or not. By the measuring processes, recipes of the fabricating processes may be optimized and defects of semiconductor devices may be detected early.

As semiconductor devices are scaled down, there are increasing demands for methods and systems capable of reliably measuring parameters of fine patterns in semiconductor devices.

SUMMARY

Embodiments of the inventive concepts may provide a method of manufacturing a semiconductor device.

Embodiments of the inventive concepts may provide semiconductor measurement systems capable of improving reliability of measurement.

Embodiments of the inventive concepts may also provide methods of measuring a semiconductor device capable of improving reliability of measurement.

According to certain aspects, a method of manufacturing a semiconductor device includes: loading a semiconductor substrate on a stage of a sensing chamber of a manufacturing chamber; performing a first measurement of the semiconductor substrate using a sensor of the sensing chamber; after performing the measurement, transferring the semiconductor substrate to a processing chamber of the manufacturing chamber; processing the substrate in the processing chamber to form a layer and/or pattern on the substrate; after the processing, transferring the semiconductor substrate back to the sensing chamber of the manufacturing chamber; performing a second measurement of the transferred semiconductor substrate using the sensor of the sensing chamber; and determining a difference between the first measurement and second measurement, and based on the difference, determining whether a particular parameter resulting from the formation of the layer and/or pattern is satisfied.

In one embodiment, the particular parameter relates to a thickness of the formed layer and/or pattern.

In one embodiment, each of the first measurement and second measurement includes performing a spectral analysis of light reflected by the substrate.

In one embodiment, the substrate is transferred between the sensing chamber and the processing chamber through an opened door disposed between the two chambers.

In one embodiment, the substrate is transferred between the sensing chamber and the processing chamber without being exposed to an outside of the manufacturing chamber.

In one embodiment, the sensing chamber includes: a measuring unit configured to receive an incident light from a light source, and to transmit a reflected light reflected from the substrate to a spectroscope; and an alignment inspecting unit configured to determine whether the substrate is aligned properly.

The measuring unit may include a beam splitter and a collimator having an elliptical shape.

The method may additionally include determining, using the alignment inspecting unit, if the substrate is aligned properly, by comparing reflected light reflected from the substrate and split by a beam splitter to incident light reflected by a reflection mirror and split by a beam splitter to determine whether the reflected light and incident light are aligned.

In one embodiment, the method further includes, when the particular parameter resulting from the formed layer and/or pattern is satisfied, performing one or more additional fabrication processes on the substrate to form a semiconductor device.

In one embodiment, the one or more addition fabrication processes includes forming at least one more layer and/or pattern on the substrate.

In one embodiment, the substrate is a semiconductor wafer and forming the semiconductor device includes singulating a semiconductor chip from the wafer.

The method may further include including the semiconductor chip in a module or a semiconductor package.

According to certain aspects, a method includes providing a semiconductor substrate in a manufacturing chamber; and while the semiconductor substrate is in the manufacturing chamber: performing at least one measurement of the semiconductor substrate using a sensor of a sensing chamber of the manufacturing chamber, transferring the semiconductor substrate between the sensing chamber and a processing chamber of the manufacturing chamber, processing the substrate in the processing chamber to form at least a first layer on the substrate, and based on the at least one measurement, determining whether a particular parameter resulting from the formation of first layer is within a target value or range.

In one embodiment, performing the at least one measurement of the semiconductor substrate includes: prior to forming the first layer, performing a first spectral analysis of the substrate using the sensor of the sensing chamber; and after forming the first layer, performing a second spectral analysis of the substrate using the sensor of the sensing chamber.

In one embodiment, transferring the semiconductor substrate between the sensing chamber and the processing chamber of the manufacturing chamber includes: transferring the semiconductor substrate from the sensing chamber to the processing chamber after performing the first spectral analysis and before forming the first layer; and transferring the semiconductor substrate to the sensing chamber from the processing chamber after forming the first layer and before performing the second spectral analysis.

In one embodiment, the substrate is transferred between the sensing chamber and the processing chamber through an opened door disposed between the two chambers.

In one embodiment, the substrate is transferred between the sensing chamber and the processing chamber without being exposed to an outside of the manufacturing chamber.

In one embodiment, when the particular parameter resulting from the formation of the first layer is within the target value or range, performing one or more additional fabrication processes on the substrate to form a semiconductor device.

According to certain aspects, a method includes loading a substrate into a sensing chamber; while the substrate is in the sensing chamber, performing a spectral analysis of the substrate; transferring the substrate between the sensing chamber and a processing chamber coupled to the sensing chamber; processing the substrate in the processing chamber to form at least a first layer and/or pattern on the substrate; and based on at least the spectral analysis, determining whether a parameter resulting from the formation of first layer and/or pattern is satisfied.

In one embodiment, transferring the substrate between the sensing chamber and the processing chamber coupled to the sensing chamber includes transferring the substrate through an opened door connected between the sensing chamber and the process chamber.

BRIEF DESCRIPTION OF THE DRAWINGS

The disclosed embodiments will become more apparent in view of the attached drawings and accompanying detailed description.

DETAILED DESCRIPTION OF THE EMBODIMENTS

Figure 1:
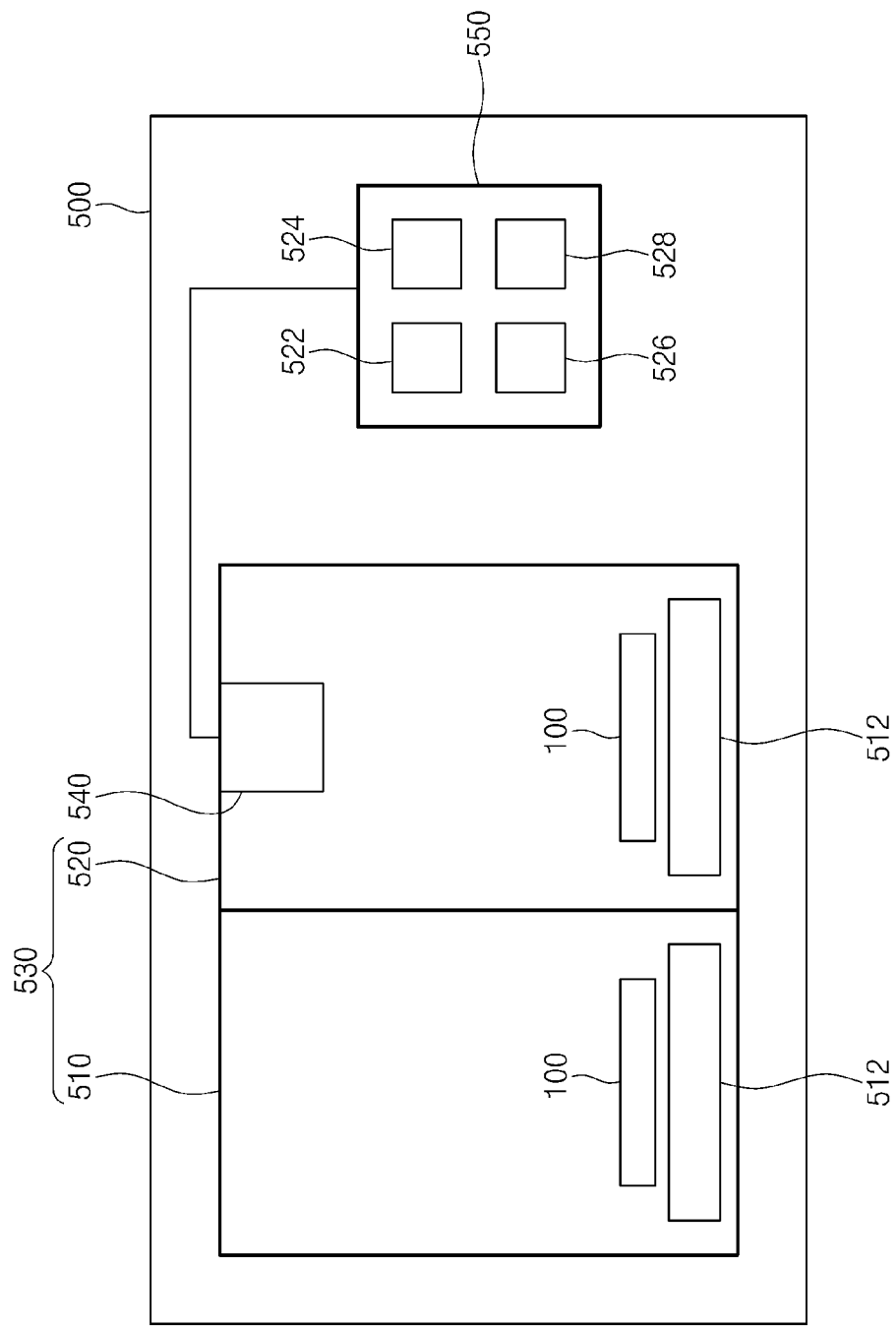
FIG. 1 is a schematic diagram illustrating a semiconductor measurement system according to example embodiments of the inventive concepts.

The present disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. The term "contact" as used here, refers to direct contact (i.e., touching), unless specifically indicated otherwise. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to fabricating techniques and/or allowable errors. Therefore, the embodiments of the inventive concepts are not limited to the specific shape illustrated in the exemplary views, but may include other shapes that may be created according to fabricating processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless the context indicates otherwise, these terms are only used to distinguish one element from another element, for example as a naming convention. Thus, a first element in some embodiments could be termed a second element in other embodiments or in one or more claims without departing from the teachings of the present invention. Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of fabricating techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
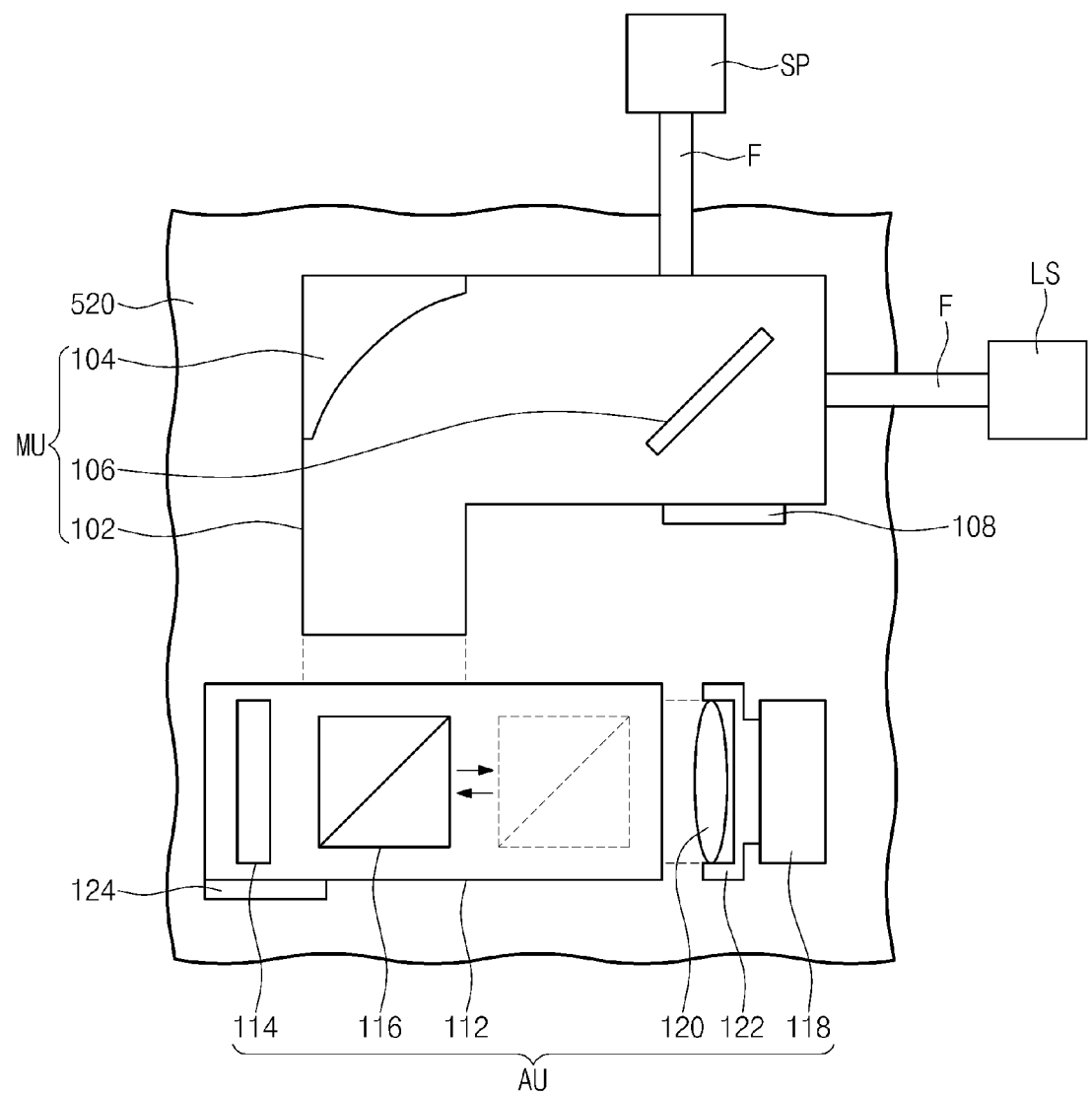
FIG. 2 is a schematic diagram illustrating a measurement sensor of FIG. 1, according to one exemplary embodiment.
Figure 3:
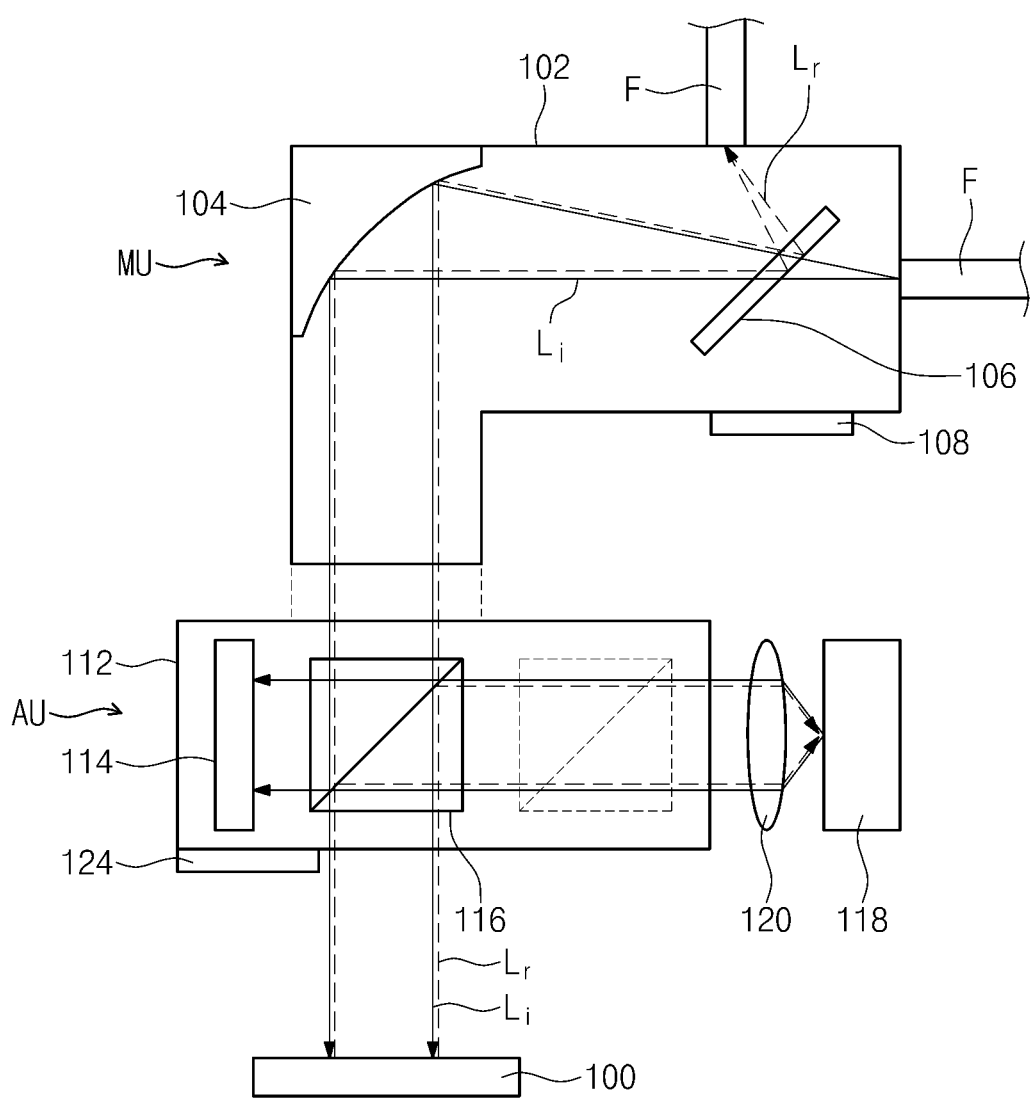
FIG. 3 is a conceptual diagram illustrating a measurement sensor of FIG. 1 in detail, according to one exemplary embodiment.

FIG. 1 is a schematic diagram illustrating a semiconductor measurement system according to example embodiments of the inventive concepts. FIG. 2 is a schematic diagram illustrating a measurement sensor of FIG. 1, according to one embodiment, and FIG. 3 is a conceptual diagram illustrating a measurement sensor of FIG. 1 in more detail, according to one embodiment.

Referring to FIG. 1, a semiconductor measurement system 500 may include a processing tool 530 and a computer system 550. A process of forming a semiconductor device may be performed in the processing tool 530.

The processing tool 530 may include a processing chamber 510 and a buffer chamber 520. The processing chamber 510 and the buffer chamber 520 (also referred to as a measurement chamber or sensing chamber) may be coupled together to form a single manufacturing chamber. The process of forming, or fabricating, the semiconductor device on a substrate 100 may be performed in the processing chamber 510. In certain embodiments, the buffer chamber 520 may provide a path through which the substrate 100 is transferred into the processing chamber 510. For example, in one embodiment, the substrate 100 may be a semiconductor wafer. The semiconductor wafer may be processed to form semiconductor devices that include, for example, one or more semiconductor chips singulated from the wafer.

As used herein, a semiconductor device may refer to a semiconductor chip (e.g., memory chip and/or logic chip formed on a die from a wafer), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include logic devices, or memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

In one embodiment, the process of forming the semiconductor device (e.g., the fabrication processes of adding, removing, or patterning materials on the substrate) is not performed in the buffer chamber 520. For example, a deposition process of depositing a layer on the substrate 100 may be performed in the processing chamber 510. The buffer chamber 520 may be coupled to the processing chamber 510, and may include certain optical and sensing equipment not included in the processing chamber 510. The substrate 100 may be transferred from the buffer chamber 520 to the processing chamber 510 or from the processing chamber 510 to the buffer chamber 520 through a door (not shown) provided between the buffer chamber 520 and the processing chamber 510. The door may be connected between the buffer chamber 520 and the processing chamber 510, and may be opened to allow transfer of the substrate between the buffer chamber 520 and the processing chamber 510 without exposing the substrate outside of the manufacturing chamber. The door may have one of different types of forms, such as a hinged door, sliding door, window-type door, etc. Each of the processing chamber 510 and the buffer chamber 520 may include a stage 512, also described herein as a platform, on which the substrate 100 is loaded and from which the substrate is unloaded.

The semiconductor measurement system 500 may further include a measurement sensor 540 coupled to the buffer chamber 520. The measurement sensor 540 may measure an optical signal of a pattern formed on the substrate 100 while the substrate 100 is provided in the buffer chamber 520. The optical signal may include, for example, spectrum data.

Referring to FIGS. 2 and 3, the measurement sensor 540 may include a light source LS providing incident light $L_i$ to the substrate 100 disposed in the buffer chamber 520, a spectroscope SP measuring spectrum data of light $L_r$ reflected from the substrate 100 ($L_r$ is also described herein as reflected light or substrate-reflected light), and a measuring unit MU provided within the buffer chamber 520. In one embodiment, the light source LS and the spectroscope SP may be disposed outside the buffer chamber 520 and may be connected to the measuring unit MU through optical fibers F penetrating the buffer chamber 520. In some embodiments, the light source LS may generate light of a broad wavelength band, and the optical fiber F may be a bundle-type optical fiber. Even though not shown in the drawings, the measurement sensor 540 may further include a condensing lens disposed between the light source LS and the optical fiber F connected to the light source LS. The condensing lens may condense the light generated in the light source LS and may provide the condensed light to the optical fiber F connected to the light source LS.

In one embodiment, the measuring unit MU may include a collimator 104 and a first beam splitter 106. The collimator 104 may convert the incident light $L_i$ into parallel light to provide the parallel light to the substrate 100. The first beam splitter 106 may change an optical path of the reflected light $L_r$ differently from an optical path of the incident light $L_i$ to provide the reflected light $L_r$ to the spectroscope SP. In some embodiments, the collimator 104 may be a reflection-type collimator using an elliptical mirror.

In more detail, the incident light $L_i$ generated from the light source LS may pass through the first beam splitter 106 and may be then provided to the collimator 104 so as to be changed into the parallel light. The collimator 104 may provide the incident light $L_i$ changed into the parallel light to the substrate 100 in a direction perpendicular to a top surface of the substrate 100. Since the incident light $L_i$ is provided in the direction perpendicular to the top surface of the substrate 100, the reflected light $L_r$ reflected from the substrate 100 may travel along the same optical path as the incident light $L_i$ so as to be provided to the first beam splitter 106 via the collimator 104. The reflected light $L_r$ may deviate from the optical path of the incident light $L_i$ at the first beam splitter 106, so as to be provided to the spectroscope SP through the optical fiber F connected to the spectroscope SP.

According to embodiments of the inventive concepts, the light source LS generating the light of the broad wavelength band may be connected to the bundle-type optical fiber F to provide the incident light $L_i$ being a multi-wavelength light. Since the multi-wavelength incident light $L_i$ is converted into the parallel light by the reflection-type collimator 104 using the elliptical mirror, a chromatic aberration influence caused by the multi-wavelength light may be reduced or minimized and a wide region of the surface of the substrate 100 may be inspected by the parallel light. As a result, the spectroscope SP may measure the spectrum data in which an influence caused by patterns formed on the substrate 100 is minimized.

The measuring unit MU may further include a measuring unit frame 102 within which the collimator 104 and the first beam splitter 106 are fixed. In this case, the optical fibers F may be connected to a sidewall of the measuring unit frame 102.

According to some embodiments, the measurement sensor 540 may further include a light-intensity sensor 108 monitoring the intensity of the incident light $L_i$. A portion of the incident light $L_i$ may be divided by the first beam splitter 106 so as to be provided to the light-intensity sensor 108. The light-intensity sensor 108 may be fixed on an outer surface of the measuring unit frame 102, as illustrated in FIGS. 2 and 3. However, the inventive concepts are not limited thereto.

The measurement sensor 540 may further include an alignment inspecting unit AU provided within the buffer chamber 520. The alignment inspecting unit AU may be provided between the substrate 100 and the measuring unit MU. The alignment inspecting unit AU may inspect a degree of alignment between the measurement sensor 540 and the substrate 100.

The alignment inspecting unit AU may include a second beam splitter 116, a reflection mirror 114, and a detector 118. The second beam splitter 116 may be disposed to overlap with the optical path of each of the incident light $L_i$ and the reflection light $L_r$ during the inspection of the degree of the alignment between the measurement sensor 540 and the substrate 100. The reflection mirror 114 may be disposed at a side of the second beam splitter 116. The detector 118 may be horizontally spaced apart from the reflection mirror 114 with the second beam splitter 116 interposed therebetween. The reflection mirror 114 and the detector 118 may be respectively disposed at positions that do not overlap with the optical paths of the incident light $L_i$ and the reflection light $L_r$. The alignment inspecting unit AU may further include a condensing lens 120 disposed between the second beam splitter 116 and the detector 118.

In more detail, during the inspection of the degree of the alignment between the measurement sensor 540 and the substrate 100, a portion of the incident light $L_i$ may be divided by the second beam splitter 116 so as to be provided to the reflection mirror 114 and another portion of the incident light $L_i$ may pass through the second beam splitter 116 so as to be provided to the substrate 100. The portion of the incident light $L_i$ provided to the reflection mirror 114 may be reflected by the reflection mirror 114, and the light reflected by the reflection mirror 114 may pass through the second beam splitter 116 so as to be provided to the detector 118 through the condensing lens 120, thereby forming an image. In addition, during the inspection of the degree of the alignment between the measurement sensor 540 and the substrate 100, a portion of the reflected light $L_r$ may be divided by the second beam splitter 116 so as to be provided to the detector 118 through the condensing lens 120, thereby forming an image. The degree of the alignment between the measurement sensor 540 and the substrate 100 may be inspected using image data formed in the detector 118. This will be described later in more detail.

The second beam splitter 116 may be a moveable beam splitter. Thus, after the inspection of the alignment degree between the measurement sensor 540 and the substrate 100 is completed, the second beam splitter 116 may move to deviate from the optical paths of the incident light $L_i$ and the reflected light $L_r$.

The alignment inspecting unit AU may include a first alignment inspecting unit frame 112 and a second alignment inspecting unit frame (not shown). The reflection mirror 114 and the second beam splitter 116 may be installed within the first alignment inspecting unit frame 112. The condensing lens 120 and the detector 118 may be installed in the second alignment inspecting unit frame. The measuring unit frame 102 may be coupled to a top portion of the first alignment inspecting unit frame 112, and the second alignment inspecting unit frame may be coupled to a side of the first alignment inspecting unit frame 112 (e.g., by a physical connection).

According to some embodiments, the measurement sensor 540 may further include a sensor 124 sensing the substrate 100 provided in the buffer chamber 520. The sensor 124 may be provided such that the light source LS may be controlled to be turned on only when the substrate 100 is loaded on the stage 512 of the buffer chamber 520. The sensor 124 may be installed on an outer surface of the first alignment inspecting unit frame 112, as illustrated in FIGS. 2 and 3. However, the inventive concepts are not limited thereto.

Referring again to FIG. 1, the computer system 550 may process an optical signal obtained from the measurement sensor 540. The computer system 550 may include a controller 522 processing various data, and a memory device 524 storing various data. The memory device 524 may include a non-volatile memory unit. In some embodiments, the memory device 524 may include, for example, a hard disk and/or a non-volatile semiconductor memory device (e.g., a flash memory device, a phase change memory device, and/or a magnetic memory device). Functions of the controller 522 and the memory device 524 will be described later in more detail. In addition, the computer system 550 may further include an input/output (I/O) unit 526 and an interface unit 528. The I/O unit 526 may include I/O hardware, software, and circuitry, such as at least one of a keyboard, a keypad, or a display device. The data obtained from the measurement sensor 540 may be transferred to the computer system 550 through the interface unit 528. In addition, the data processed in the computer system 550 may be transferred to the measurement sensor 540 through the interface unit 528. The interface unit 528 may include interface hardware, software, and/or circuitry, such as at least one of a cable element, a wireless element, or a universal serial bus (USB) port. The controller 522, the memory device 524, the I/O unit 526, and the interface unit 528 may communicate with each other through a data bus.

A semiconductor device may be measured using the semiconductor measurement system 500. A method of measuring the semiconductor device will be described hereinafter.

Figure 4:
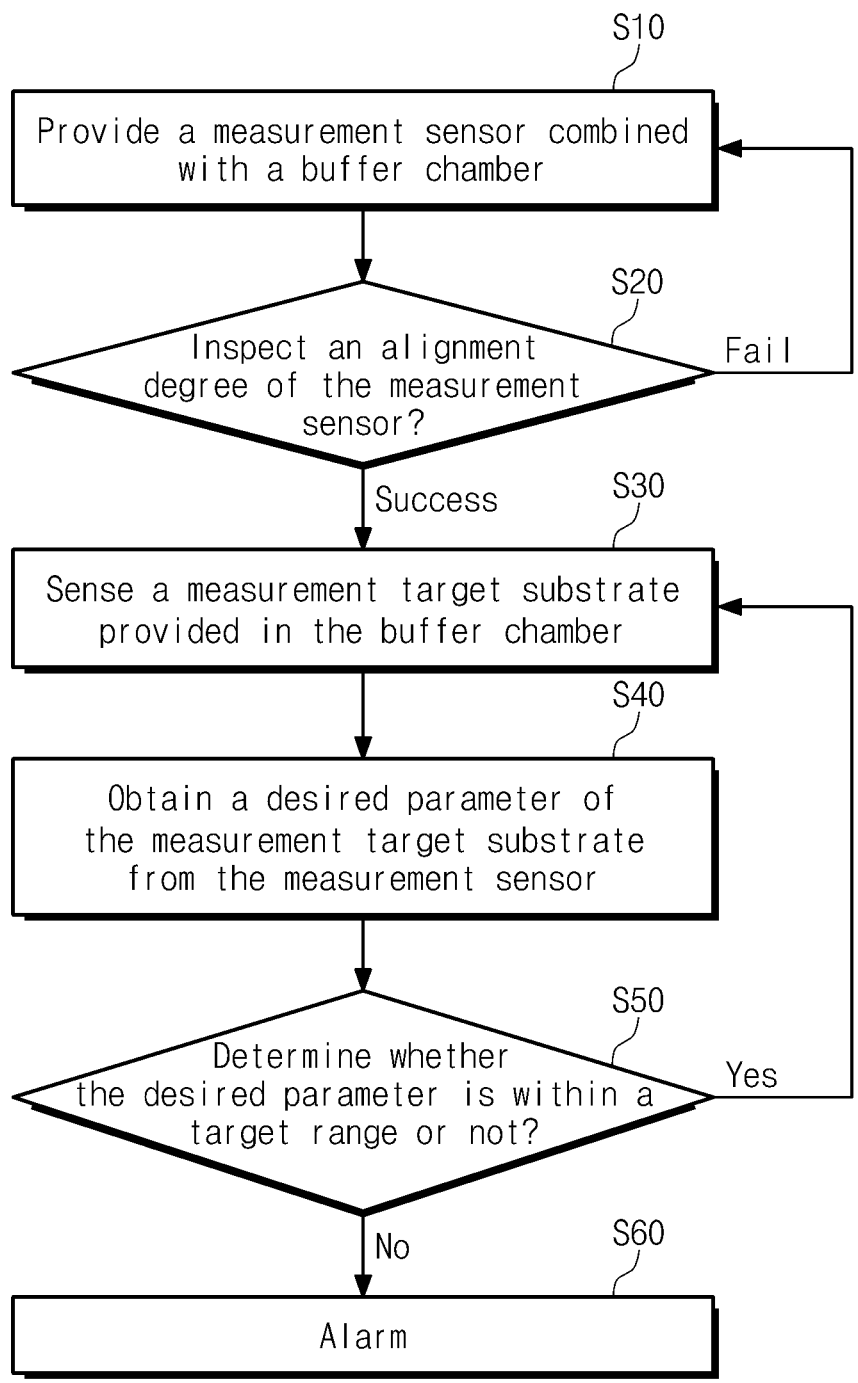
FIG. 4 is a flowchart illustrating a method of measuring a semiconductor device according to example embodiments of the inventive concepts.
Figure 5:
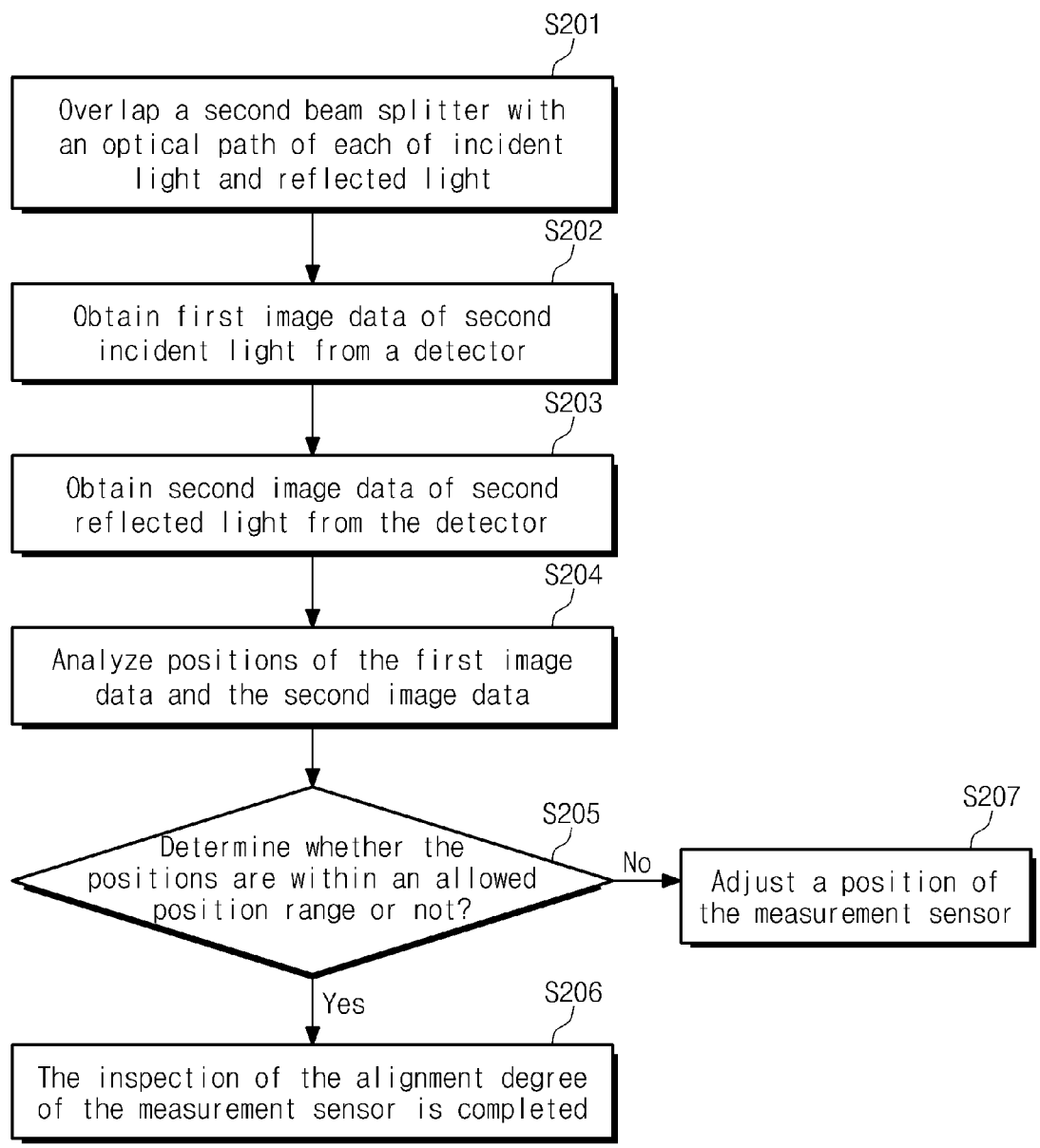
FIG. 5 is a flowchart illustrating a step S20 of FIG. 4 according to some embodiments of the inventive concepts.

FIG. 4 is a flowchart illustrating a method of measuring a semiconductor device according to example embodiments of the inventive concepts. FIG. 5 is a flowchart illustrating a step S20 of FIG. 4 according to some embodiments of the inventive concepts, and FIGS. 6A to 6D are conceptual diagrams illustrating a step S20 of FIG. 4 according to some embodiments of the inventive concepts.

Referring to FIGS. 1, 2, 3, and 4, the measurement sensor 540 may be provided in the buffer chamber 520 coupled to the processing chamber 510 (S10). The measurement sensor 540 may include the measuring unit MU provided within the buffer chamber 520, the light source LS and the spectroscope SP connected to the measuring unit MU through the optical fibers F, and the alignment inspecting unit AU disposed between the measuring unit MU and the stage 512 within the buffer chamber 520.

The measuring unit MU may include the collimator 104 and the first beam splitter 106. The collimator 104 may convert the incident light $L_i$ inputted from the light source LS into the parallel light and may provide the parallel light to the substrate 100 loaded on the stage 512 of the buffer chamber 520. The first beam splitter 106 may change the optical path of the reflected light $L_r$ differently from the optical path of the incident light $L_i$ to provide the reflected light $L_r$ to the spectroscope SP.

The alignment inspecting unit AU may include the second beam splitter 116, the reflection mirror 114, and the detector 118. The second beam splitter 116 may be located to overlap with the optical path of each of the incident light $L_i$ and the reflected light $L_r$ during the inspection of the alignment degree between the measuring sensor 540 and the substrate. The reflection mirror 114 and the detector 118 may be horizontally spaced apart from each other with the second beam splitter 116 interposed therebetween. The alignment inspecting unit AU may further include the condensing lens 120 disposed between the second beam splitter 116 and the detector 118.

After the measurement sensor 540 is prepared (S10), the substrate 100 may be provided on (e.g., loaded on) the stage 512 of the buffer chamber 520. In certain embodiments, a test substrate 100 may be used to inspect the alignment degree between the substrate 100 and the measurement sensor 540. Thereafter, the alignment degree between the substrate 100 and the measurement sensor 540 may be inspected (S20). In some embodiments, the alignment degree of the measurement sensor 540 may be inspected using the alignment inspecting unit AU.

Figure 6A:
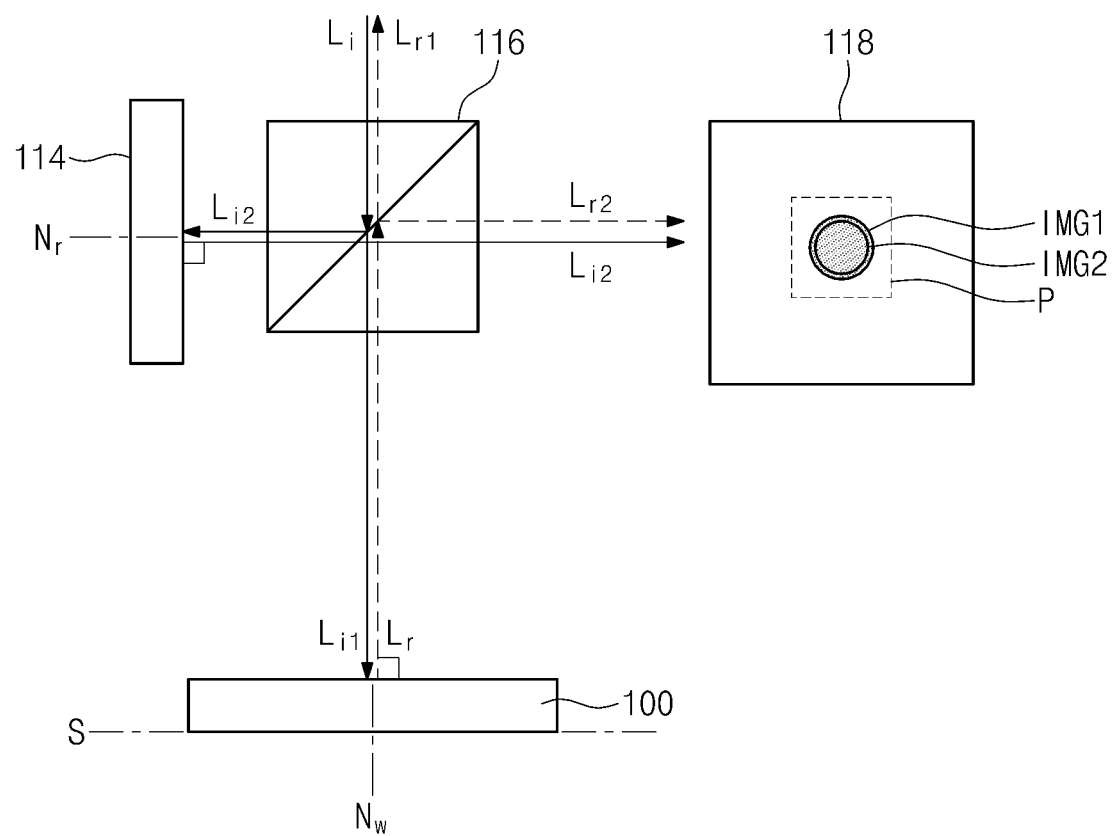
FIGS. 6A to 6D are conceptual diagrams illustrating a step S20 of FIG. 4 according to some embodiments of the inventive concepts.

Referring to FIGS. 3, 5, and 6A, the second beam splitter 116 may be located to overlap with the optical path of each of the incident light $L_i$ and the reflected light $L_r$ (S201). The incident light $L_i$ may be divided into first incident light $L_{i1}$ and second incident light $L_{i2}$ by the second beam splitter 116. The first incident light $L_{i1}$ may be provided to the substrate 100 and the second incident light $L_{i2}$ may be provided to the reflection mirror 114. The second incident light $L_{i2}$ may be reflected by the reflection mirror 114 and then may pass through the second beam splitter 116 so as to be provided to the detector 118. The second incident light $L_{i2}$ may be provided to the detector 118 through the condensing lens 120, thereby forming an image. Thus, the detector 118 may detect first image data IMG1. In addition, the reflected light $L_r$ may be divided into first reflected light $L_{r1}$ and second reflected light $L_{r2}$ by the second beam splitter 116. The first reflected light $L_{r1}$ may be provided to the spectroscope SP and the second reflected light $L_{r2}$ may be provided to the detector 118. The second reflected light $L_{r2}$ may be provided to the detector 118 through the condensing lens 120, thereby forming an image. Thus, the detector 118 may detect second image data IMG2.

The controller 522 of FIG. 1 may obtain the first image data IMG1 from the detector 118 (S202). The obtained first image data IMG1 may be stored in the memory device 524. Likewise, the controller 522 may obtain the second image data IMG2 from the detector 118 (S203). The obtained second image data IMG2 may be stored in the memory device 524.

Referring to FIGS. 5 and 6A to 6D, the controller 522 may analyze positions of the first image data IMG1 and the second image data IMG2 (S204). In more detail, the first image data IMG1 and the second image data IMG2 may be formed on the same plane of the detector 118, and the controller 522 may analyze the positions of the first image data IMG1 and the second image data IMG2 on the same plane. For example, outlines of the images may be compared to determine the positions on the plane.

Thereafter, whether the positions of the first image data IMG1 and the second image data IMG2 are in an allowed position range or not may be determined (S205). For example, the allowed position range may be a predetermined or particular designated position range on a plane of the detector 118. The range may include, for example, a centralized portion of the detector, having a certain percentage of the area of the overall detector (e.g., 10%-20%). If the positions of the first image data IMG1 and the second image data IMG2 are in the allowed position range, the inspection of the alignment degree of the measurement sensor 540 (S20 of FIG. 4) may be completed (S206). If the positions of the first image data IMG1 and the second image data IMG2 are beyond the allowed range, in one embodiment, the positions of the measurement sensor 540 may be adjusted in the step S10 of FIG. 4 (S207) (e.g., so that the first image data IMG1 and second image data IMG2 fall within the particular designated position range).

In some embodiments, as illustrated in FIG. 6A, if the measurement sensor 540 is aligned with the substrate 10, the incident light $L_i$ may be vertically incident on the top surface of the substrate 100. The first incident light $L_{i1}$ may have an incidence angle of 0 degree with respect to a normal line $N_w$ perpendicular to the top surface of the substrate 100. The second incident light $L_{i2}$ may have an incidence angle of 0 degree with respect to a normal line $N_r$ perpendicular to a reflection surface of the reflection mirror 114. The second incident light $L_{i2}$ may be reflected from the reflection mirror 114 so as to be provided to the detector 118. The second incident light $L_{i2}$ may have a reflection angle of 0 degree with respect to the normal line $N_r$ of the reflection mirror 114. As a result, the first image data IMG1 may be formed in the allowed range P of the detector 118. Since the first incident light $L_{i1}$ has the incidence angle of 0 degree with respect to the normal line $N_w$ of the substrate 100, the reflected light $L_r$ may have a reflection angle of 0 degree with respect to the normal line $N_w$ of the substrate 100 and may be provided to the second beam splitter 116 through the same optical path as the first incident light $L_{i1}$. Thus, the second reflected light $L_{r2}$ may be provided to the detector 118 through the same optical path of the second incident light $L_{i2}$, and the second image data IMG2 may be formed in the allowed range P to overlap with the first image data IMG1. In this case, the inspection of the alignment degree of the measurement sensor 540 (S20 of FIG. 4) may be completed (S206), and the inspection passes. Hereinafter, a reference plane S may be defined for the purpose of ease and convenience in explanation. The reference plane S is defined as a plane parallel to the top surface of the substrate 100 when the measurement sensor 540 is aligned with the substrate 100.

Figure 6B:
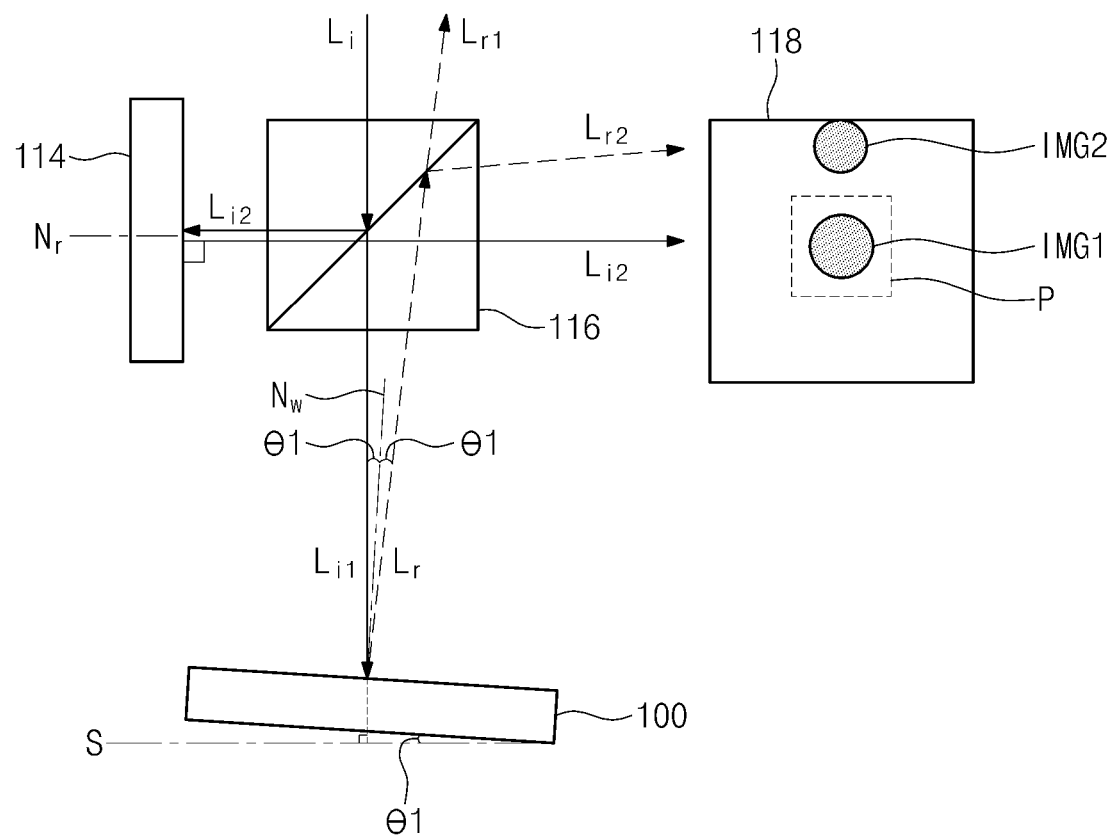

In other embodiments, as illustrated in FIG. 6B, the substrate 100 may be tilted with respect to the reference plane S at a predetermined angle $\theta 1$, and the incident light $L_i$ may be perpendicular to the reference plane S. Thus, misalignment may occur between the measurement sensor 540 and the substrate 100. In this case, the first incident light $L_{i1}$ may have an incidence angle corresponding to the predetermined angle $\theta 1$ with respect to the normal line $N_w$ of the substrate 100, and the second incident light $L_{i2}$ may have the incidence angle of 0 degree with respect to the normal line $N_r$ of the reflection mirror 114. The second incident light $L_{i2}$ may be reflected by the reflection mirror 114 at a reflection angle of 0 degrees with respect to the normal line $N_r$ of the reflection mirror 114 so as to be provided to the detector 118. Thus, the first image data IMG1 may be formed in the allowed range P of the detector 118. Since the first incident light $L_{i1}$ has the incidence angle of the predetermined angle $\theta 1$ with respect to the normal line $N_w$ of the substrate 100, the reflected light $L_r$ may have a reflection angle of the predetermined angle $\theta 1$ with respect to the normal line $N_w$ of the substrate 100 and may be provided to the second beam splitter 116 through an optical path different from the optical path of the first incident light $L_{i1}$. Thus, the second reflected light $L_{r2}$ may be provided to the detector 118 through an optical path different from the optical path of the second incident light $L_{i2}$, and the second image data IMG2 may be formed beyond the allowed range P. In this case, the position of the substrate 100 may be adjusted in the buffer chamber 520 such that the first image data IMG1 overlaps with the second image data IMG2 in the allowed range P.

Figure 6C:
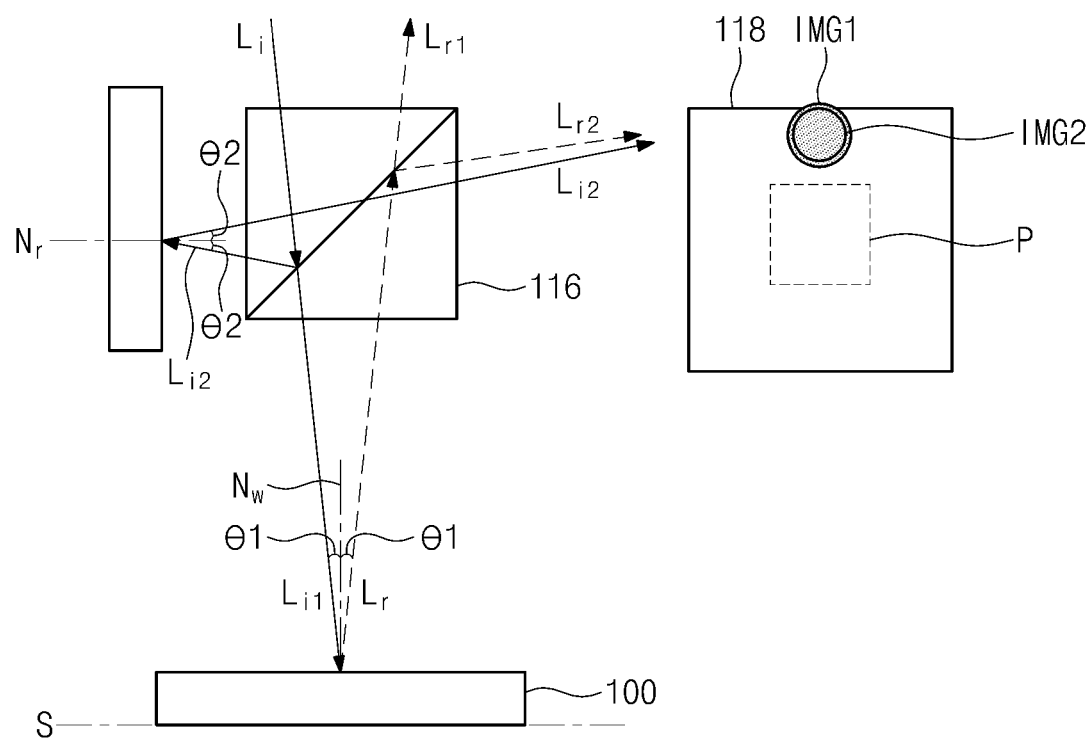

In still other embodiments, as illustrated in FIG. 6C, the top surface of the substrate 100 may be parallel to the reference surface S but the incident light $L_i$ may be inputted in a direction tilted with respect to the reference surface S. Thus, misalignment may occur between the measurement sensor 540 and the substrate 100. In this case, the first incident light $L_{i1}$ may have an incidence angle of a first angle $\theta 1$ with respect to the normal line $N_w$ of the substrate 100, and the second incident light $L_{i2}$ may have an incidence angle of the second angle $\theta 2$ with respect to the normal line $N_r$ of the reflection mirror 114. The second incident light $L_{i2}$ may be reflected by the reflection mirror 114 at a reflection angle of the second angle $\theta 2$ with respect to the normal line $N_r$ of the reflection mirror 114 so as to be provided to the detector 118. Thus, the first image data IMG1 may be formed beyond the allowed range P of the detector 118. Since the first incident light $L_{i1}$ has the incidence angle of the first angle $\theta 1$ with respect to the normal line $N_w$ of the substrate 100, the reflected light $L_r$ may have a reflection angle of the first angle $\theta 1$ with respect to the normal line $N_w$ of the substrate 100 and may be provided to the second beam splitter 116 through an optical path different from the optical path of the first incident light $L_{i1}$. Thus, the second reflected light $L_{r2}$ may be provided to the detector 118 through the substantially same optical path as the second incident light $L_{i2}$, and the second image data IMG2 may be formed beyond the allowed range P. The second image data IMG2 may overlap with the first image data IMG1. In this case, the position of the measurement sensor 540 may be adjusted in the buffer chamber 520 such that the first image data IMG1 overlaps with the second image data IMG2 in the allowed range P.

Figure 6D:
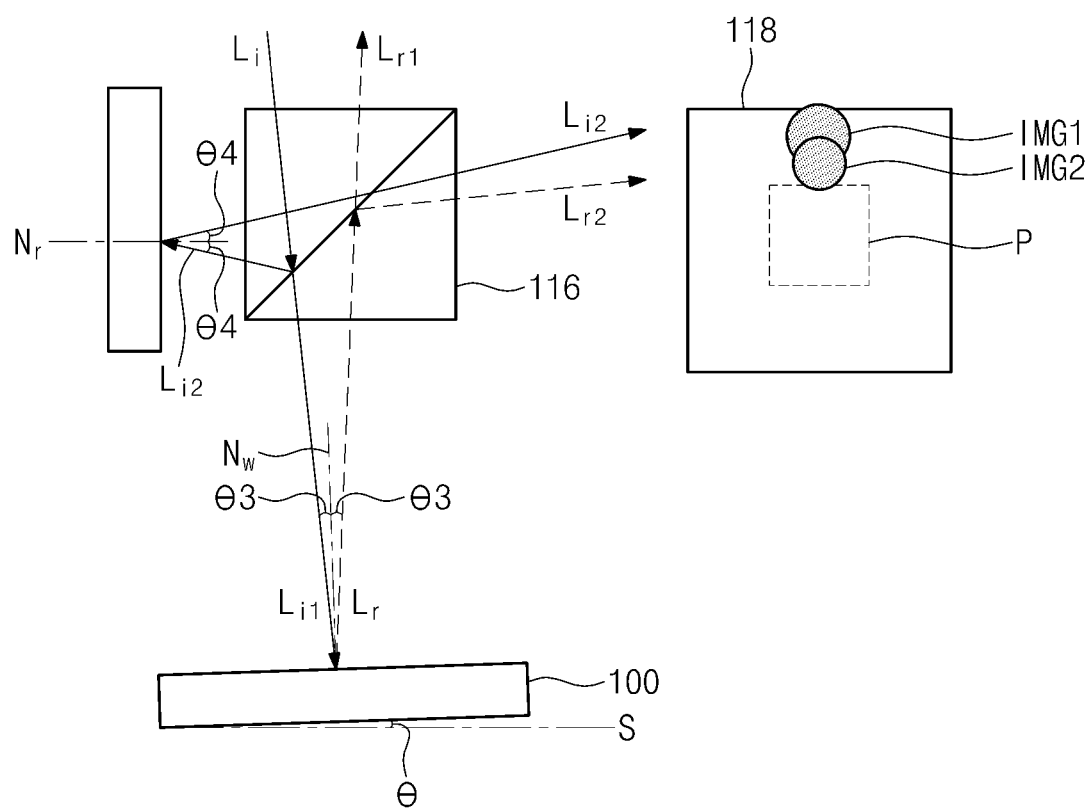

In yet other embodiments, as illustrated in FIG. 6D, the top surface of the substrate 100 may be tilted with respect to the reference plane S at a predetermined angle $\theta$, and the incident light $L_i$ may also be provided in a direction tilted with respect to the reference surface S. Thus, misalignment may occur between the measurement sensor 540 and the substrate 100. In this case, the first incident light $L_{i1}$ may have an incidence angle of a third angle $\theta 3$ with respect to the normal line $N_w$ of the substrate 100, and the second incident light $L_{i2}$ may have an incidence angle of the fourth angle $\theta 4$ with respect to the normal line $N_r$ of the reflection mirror 114. The second incident light $L_{i2}$ may be reflected by the reflection mirror 114 at a reflection angle of the fourth angle $\theta 4$ with respect to the normal line $N_r$ of the reflection mirror 114 so as to be provided to the detector 118. Thus, the first image data IMG1 may be formed beyond the allowed range P of the detector 118. Since the first incident light $L_{i1}$ has the incidence angle of the third angle $\theta 3$ with respect to the normal line $N_w$ of the substrate 100, the reflected light $L_{r2}$ may have a reflection angle of the third angle θ3 with respect to the normal line $N_w$ of the substrate 100 and may be provided to the second beam splitter 116 through an optical path different from the optical path of the first incident light $L_{i1}$. Thus, the second reflected light $L_{r2}$ may be provided to the detector 118 through an optical path different from the optical path of the second incident light $L_{i2}$, and the second image data IMG2 may be formed beyond the allowed range P. The second image data IMG2 may partially overlap with the first image data IMG1 or may be separated from the first image data IMG1. In this case, the position of the measurement sensor 540 may be adjusted in the buffer chamber 520 such that the first image data IMG1 overlaps with the second image data IMG2 in the allowed range P.

After the inspection of the alignment degree of the measurement sensor 540 (S20 of FIG. 4) is completed, the second beam splitter 116 of the alignment inspecting unit AU may move to deviate from the optical paths of the incident light $L_i$ and the reflected light $L_r$.

Referring again to FIGS. 1, 2, and 4, after the inspection of the alignment degree of the measurement sensor 540 (S20 of FIG. 4) is completed, the substrate 100 provided in the buffer chamber 520 may be sensed by the sensor 124 described with reference to FIG. 2 (S30). Hereinafter, the substrate 100 may be referred to as a measurement target substrate for which a particular parameter may be determined and measured. The particular parameter of the measurement target substrate 100 may be obtained using the measurement sensor 540 (S40). For example, by obtaining a spectrum, or performing a spectral analysis, of the measurement target substrate 100, a particular parameter may be determined. A measured value of the particular parameter can then be compared to a target value or range of values to determine if the measured value falls within a target range, and thus to determine if a target parameter value is satisfied. The particular parameter, as described in more detail below, may refer to a certain physical characteristic of the substrate, or of a layer or pattern formed on the substrate (e.g., a thickness of the layer or pattern).

Figure 7:
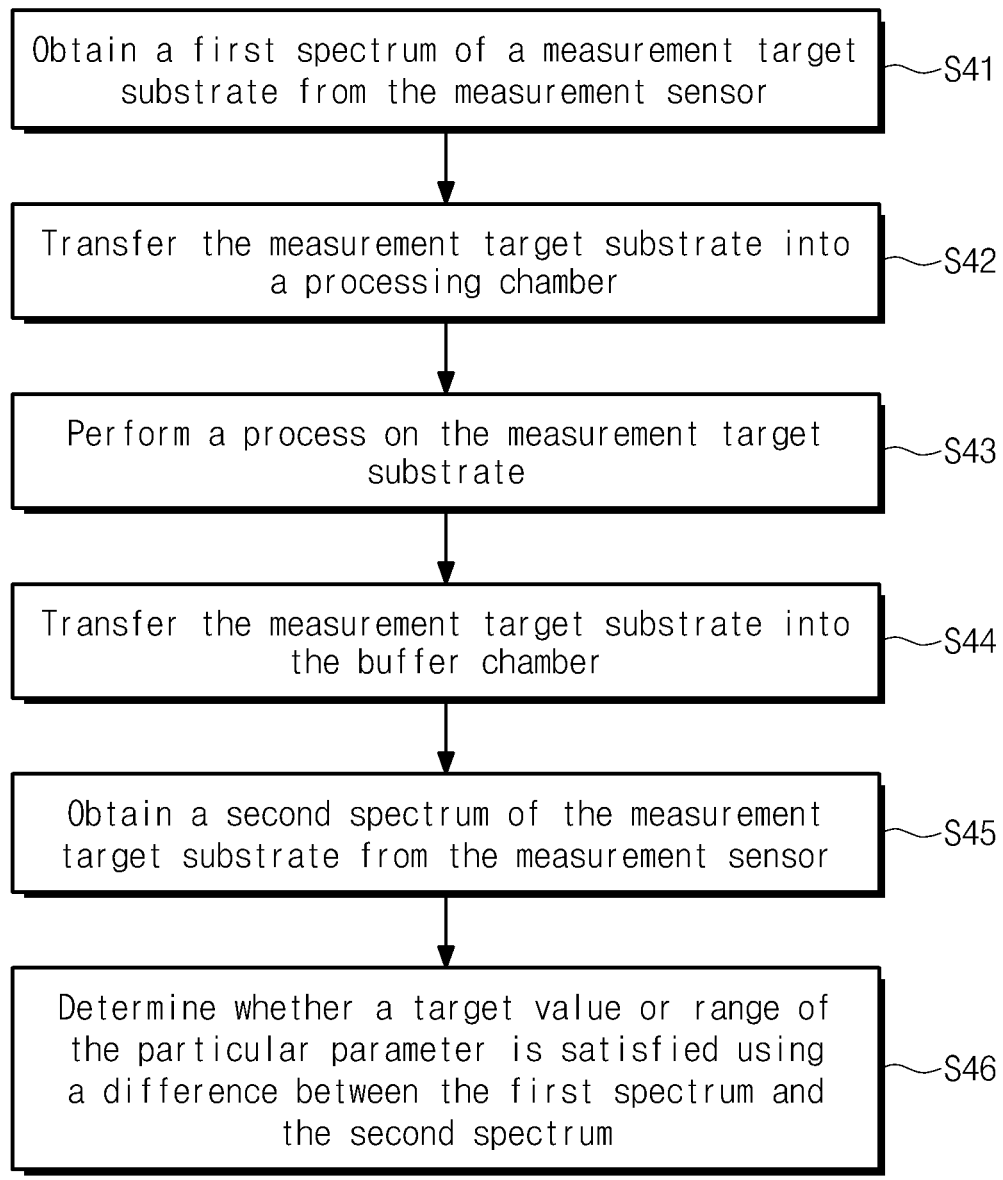
FIG. 7 is a flowchart illustrating a step S40 of FIG. 4 according to some embodiments of the inventive concepts.

FIG. 7 is a flowchart illustrating a step S40 of FIG. 4 according to some embodiments of the inventive concepts. FIGS. 8A, 8B, 9A, and 9B are conceptual diagrams for explaining a step S40 of FIG. 4 according to some embodiments of the inventive concepts.

Referring to FIGS. 2, 3, and 7, a first spectrum of the measurement target substrate 100 may be obtained using the measurement sensor 540 (S41).

In more detail, the incident light $L_i$ generated from the light source LS may pass through the first beam splitter 106 so as to be incident on the collimator 104. The incident light $L_i$ may be converted into the parallel light by the collimator 104. The incident light $L_i$ of the parallel light may be provided to the measurement target substrate 100. The reflected light $L_r$ reflected from the measurement target substrate 100 may be provided to the first beam splitter 106 along the same optical path as the incident light $L_i$ via the collimator 104. The reflected light $L_r$ may deviate from the optical path of the incident light $L_i$ at the first beam splitter 106 so as to be provided to the spectroscope SP.

Figure 8A:
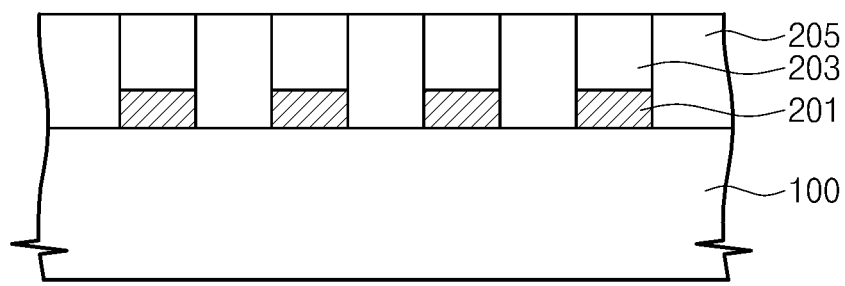
FIGS. 8A, 8B, 9A, and 9B are conceptual diagrams for explaining a step S40 of FIG. 4 according to some embodiments of the inventive concepts.

In some embodiments, the measurement target substrate 100 may include a plurality of conductive patterns 201 formed on the measurement target substrate 100, capping patterns 203 respectively formed on the conductive patterns 201, and insulating patterns 205 filling gap regions between the conductive patterns 201 and between the capping patterns 203, as illustrated in FIG. 8A. One of more of these patterns can be formed in a first fabrication process. After the first fabrication process, the substrate 100 maybe transferred to the buffer chamber 520. Continuing with FIG. 7, the spectroscope SP may measure a first spectrum S1, for example, illustrated in FIG. 9A from the reflected light $L_r$.

The controller 522 described with reference to FIG. 1 may obtain the first spectrum S1 from the spectroscope SP and may store the obtained first spectrum S1 in the memory device 524 described with reference to FIG. 1.

Referring to FIGS. 1 and 7, after the first spectrum S1 is measured, the measurement target substrate 100 may be transferred into the processing chamber 510 (S42). For example, the door between the processing chamber 510 and buffer chamber 520 may be opened, and the measurement target substrate 100 may be moved, using a robot arm or other mechanical device, from the platform 512 of the buffer chamber 520 through the opened door, and loaded onto the platform 512 of the processing chamber 510. A process for fabricating a semiconductor device on the measurement target substrate 100 may be performed in the processing chamber 510 (S43). In some embodiments, for example, a process for depositing a layer and/or forming a pattern on the measurement target substrate 100 may be performed in the processing chamber 510. For example, the deposition process may be a chemical vapor deposition (CVD) process, a physical vapor deposition (PVD) process, or an atomic layer deposition (ALD) process. After the process of fabricating the semiconductor device on the measurement target substrate 100 is performed, the measurement target substrate 100 may be transferred back into the buffer chamber 520 (S44) (e.g., through the opened door).

Referring again to FIGS. 2, 3, and 7, a second spectrum of the measurement target substrate 100 may be obtained using the measurement sensor 540 (S45).

In more detail, the incident light $L_i$ generated from the light source LS may pass through the first beam splitter 106 so as to be incident on the collimator 104. The incident light $L_i$ may be converted into the parallel light by the collimator 104. The incident light $L_i$ of the parallel light may be provided to the measurement target substrate 100. The reflected light $L_r$ reflected from the measurement target substrate 100 may be provided to the first beam splitter 106 along the same optical path as the incident light $L_i$ via the collimator 104. The reflected light $L_r$ may deviate from the optical path of the incident light $L_i$ at the first beam splitter 106 so as to be provided to the spectroscope SP.

Figure 8B:
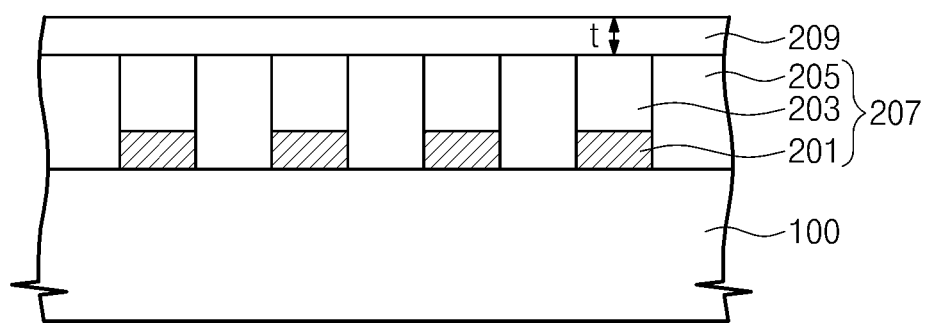
Figure 9A:
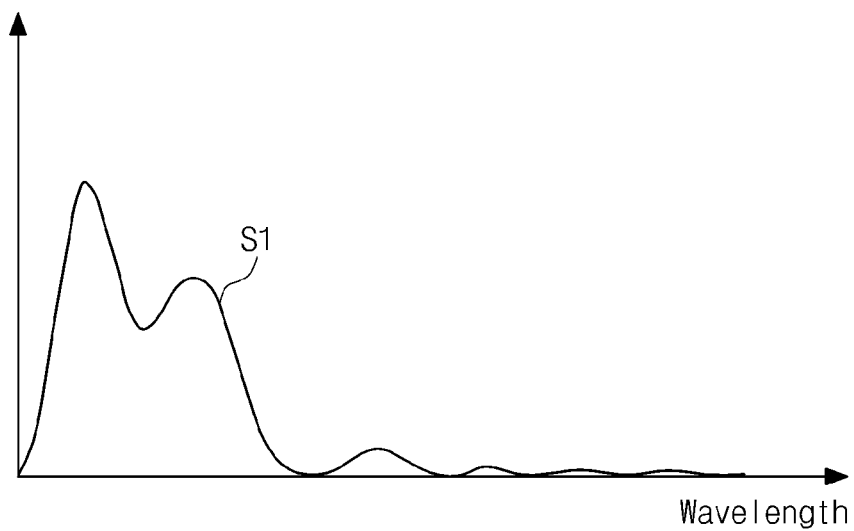
Figure 9B:
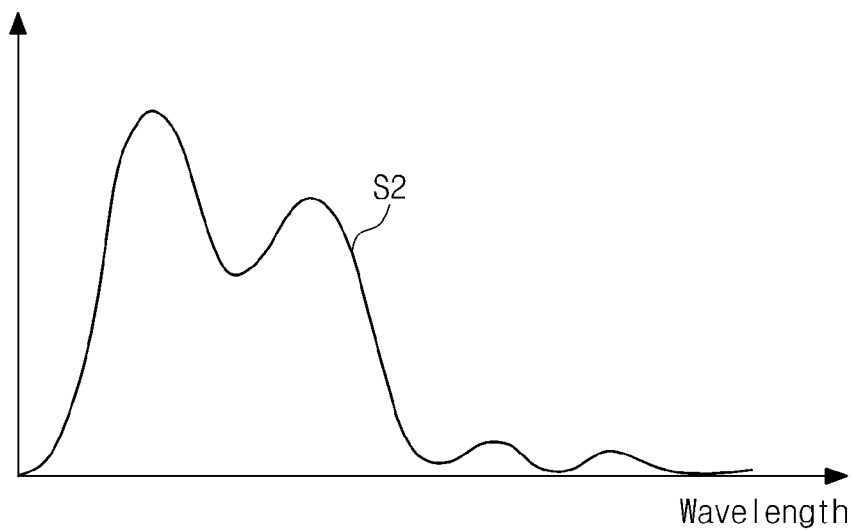

In some embodiments, the measurement target substrate 100 may include the plurality of conductive patterns 201 formed on the measurement target substrate 100, the capping patterns 203 respectively formed on the conductive patterns 201, and the insulating patterns 205 filling gap regions between the conductive patterns 201 and between the capping patterns 203, as illustrated in FIG. 8B. In some embodiments, the deposition process may be performed on the measurement target substrate 100, so the measurement target substrate 100 may further include an insulating layer 209 formed on the patterns 207. In this case, the spectroscope SP may measure a second spectrum S2, for example, illustrated in FIG. 9B from the reflected light $L_r$.

The controller 522 of FIG. 1 may obtain the second spectrum S2 from the spectroscope SP and may store the obtained second spectrum S2 in the memory device 524 of FIG. 1.

Referring again to FIGS. 1 and 7, the controller 522 may determine if a target value or range of the particular parameter is satisfied by determining a difference between the first spectrum S1 and the second spectrum S2 (S46). In some embodiments, the parameter may relate to a thickness t of the insulating layer 209 formed on the measurement target substrate 100. For example, the parameter may represent a thickness. In some embodiments, the controller 522 may obtain a skew spectrum corresponding to the difference between the first spectrum S1 and the second spectrum S2 and may determine whether the target value or range of the parameter is satisfied from the skew spectrum by means of fast Fourier transform.

Figure 10A:
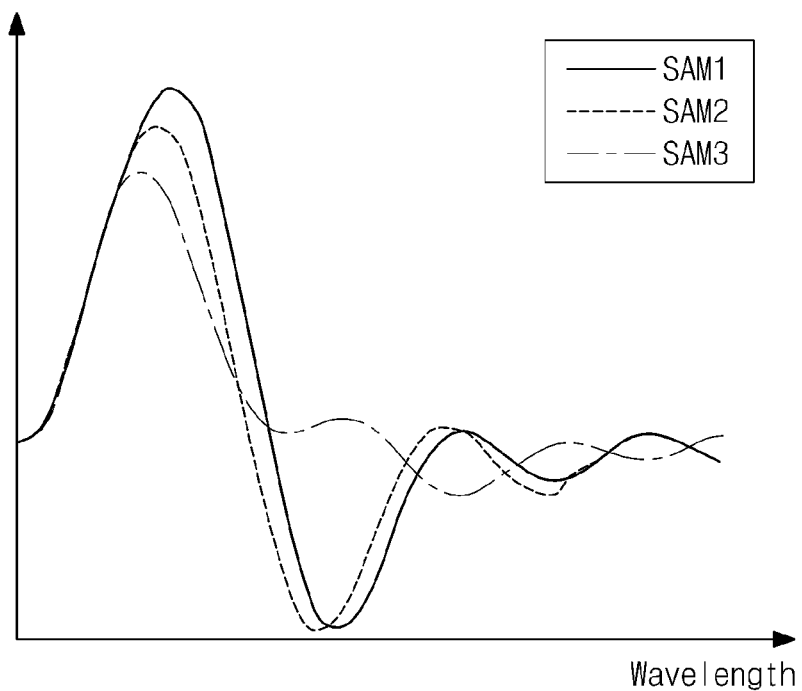
FIG. 10A is a graph illustrating a variation of a skew spectrum according to a thickness of a layer formed on a measurement target substrate according to some embodiments of the inventive concepts.
Figure 10B:
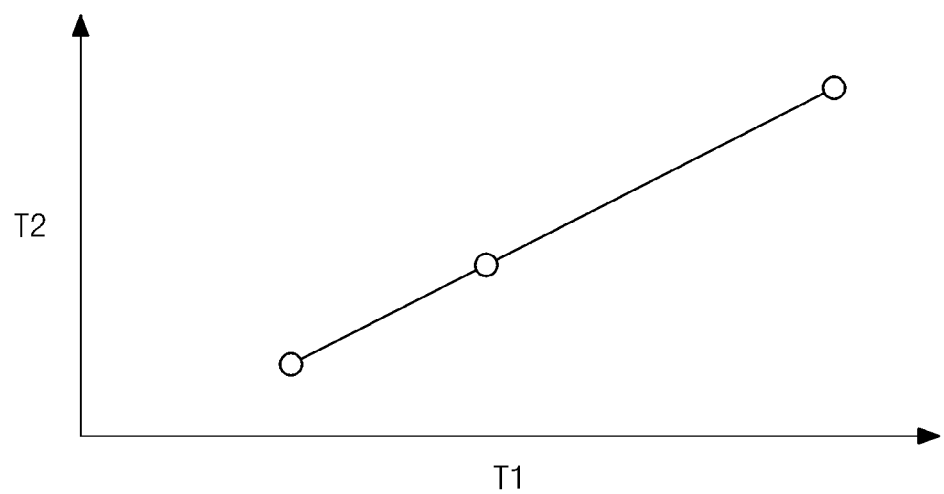
FIG. 10B is a graph illustrating a correlation between a thickness of a layer calculated from a skew spectrum of FIG. 10A and a thickness of a layer obtained by a non-destructive inspection.

FIG. 10A is a graph illustrating a variation of a skew spectrum according to a thickness of a layer formed on a measurement target substrate according to some embodiments of the inventive concepts. FIG. 10B is a graph illustrating a correlation between a thickness T1 of a layer calculated from a skew spectrum of FIG. 10A and a thickness T2 of a layer obtained by a non-destructive inspection.

Samples SAM1, SAM2, and SAM3 may be provided. Each of the samples SAM1, SAM2, and SAM3 includes the insulating layer 209 formed on the measurement target substrate 100. Here, the insulating layers 209 of the samples SAM1, SAM2, and SAM3 have thicknesses different from each other. As shown in FIG. 10A, the skew spectrums different from each other may be obtained from the samples SAM1, SAM2, and SAM3, respectively. The thicknesses T1 of the insulating layers 209 calculated from the skew spectrums and the thicknesses of the insulating layers 209 obtained by the non-destructive inspection may have a linear correlation, as illustrated in FIG. 10B. Here, the destructive inspection may be performed using a scanning electron microscope (SEM) or a transmission electron microscope (TEM).

Referring again to FIGS. 1 and 4, the controller 522 may determine whether the particular parameter is within an allowed target range or not (S50). If the particular parameter (e.g., thickness) is within the target range, which may be for example, an allowed range of thicknesses, then the substrate 100 passes inspection, and it may be removed from the manufacturing chamber and the step S30 of FIG. 4 may be restarted for a new substrate. For example, the measurement target substrate 100 of which the measurement of the particular parameter is completed may move outside of the processing tool 530 or to another space of the processing tool 530, and another measurement target substrate 100 may be provided into the buffer chamber 520 so as to be sensed by the sensor 124. If a value of the particular parameter is beyond the target range, an alarm may be generated (S60). As a result, the substrate may be transferred again to the processing chamber 510 to correct any deficiencies, the process used in the processing chamber 510 may be revised, and/or the substrate may be discarded.

Figure 11:
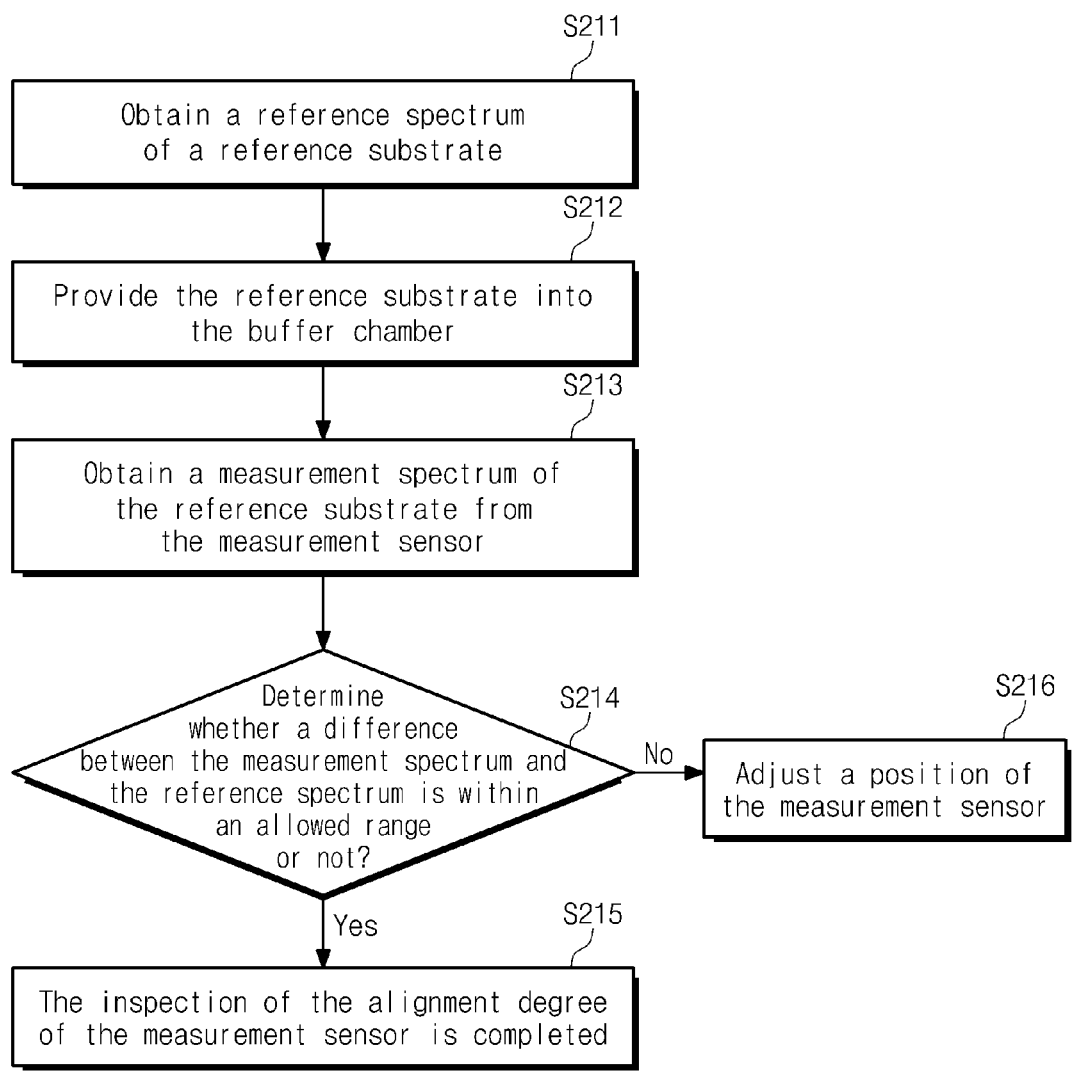
FIG. 11 is a flowchart illustrating a step S20 of FIG. 4 according to other embodiments of the inventive concepts.
Figure 12A:
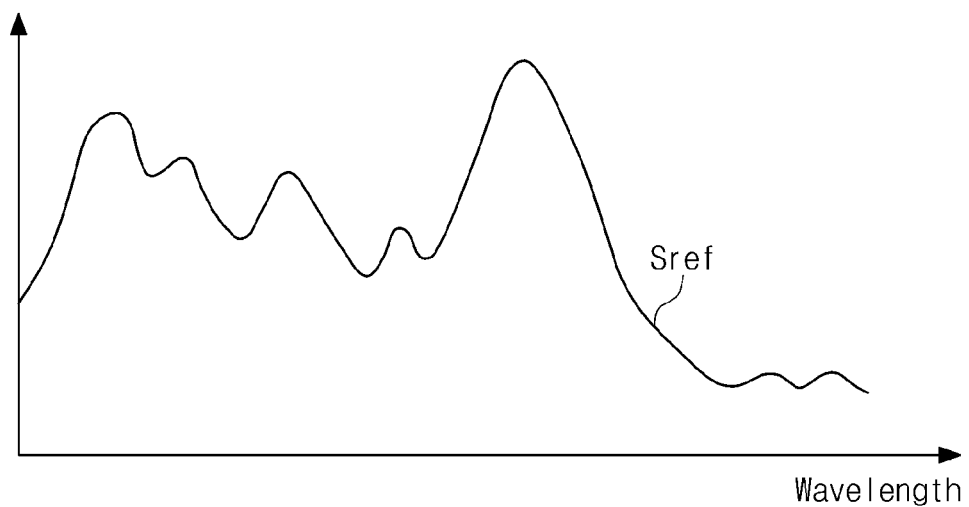
FIGS. 12A and 12B are conceptual diagrams for explaining a step S20 of FIG. 4 according to other embodiments of the inventive concepts.
Figure 12B:
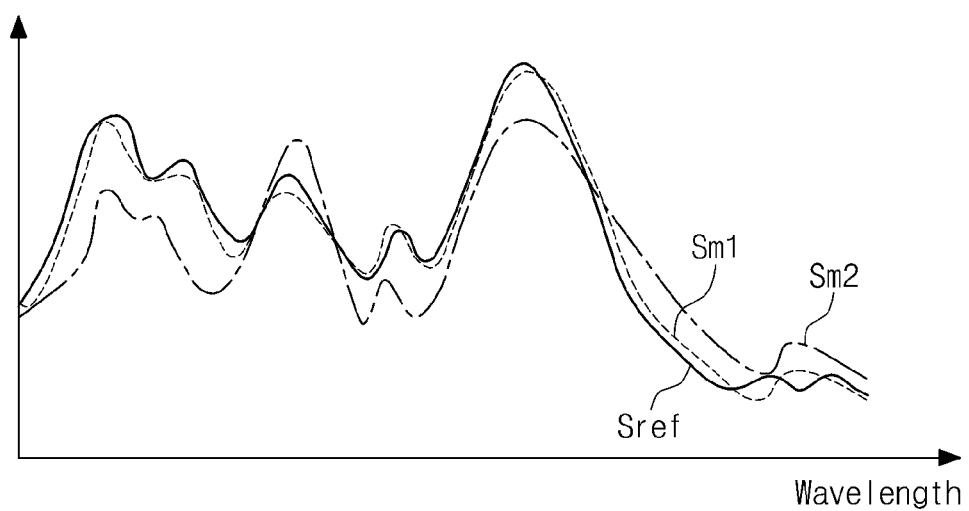

FIG. 11 is a flowchart illustrating a step S20 of FIG. 4 according to other embodiments of the inventive concepts, and FIGS. 12A and 12B are conceptual diagrams for explaining a step S20 of FIG. 4 according to other embodiments of the inventive concepts.

First, referring to FIGS. 1, 2, 3, and 4, the measurement sensor 540 may be prepared in the buffer chamber 520 coupled to the processing chamber 510 (S10). The measurement sensor 540 may include the measuring unit MU provided within the buffer chamber 520, and the light source LS and the spectroscope SP connected to the measuring unit MU through the optical fibers F.

The measuring unit MU may include the collimator 104 and the first beam splitter 106. The collimator 104 may convert the incident light $L_i$ provided from the light source LS into the parallel light and may provide the parallel light to the substrate 100 loaded on the stage 512 of the buffer chamber 520. The first beam splitter 106 may change the optical path of the reflected light $L_r$ differently from the optical path of the incident light $L_i$, so the reflected light $L_r$ may be provided to the spectroscope SP.

After the measurement sensor 540 is prepared, the alignment degree of the measurement sensor 540 may be inspected (S20). According to the present embodiment, the inspection of the alignment degree of the measurement sensor 540 may be performed using a reference substrate that has known spectrum data.

Referring to FIGS. 1 and 11, the controller 522 may obtain a known reference spectrum of the reference substrate through the interface unit 528 (S211). For example, the controller 522 may obtain the reference spectrum Sref illustrated in FIG. 12A. Thereafter, the reference substrate 100 may be provided on the stage 512 of the buffer chamber 520 (S212).

Referring to FIGS. 2, 3, and 11, a measurement spectrum of the reference substrate 100 provided in the buffer chamber 520 may be obtained using the measurement sensor 540 (S213). In more detail, the incident light $L_i$ generated from the light source LS may pass through the first beam splitter 106 so as to be incident on the collimator 104. The incident light $L_i$ may be converted into the parallel light by the collimator 104. The incident light $L_i$ of the parallel light may be provided to the reference substrate 100. The reflected light $L_r$ reflected from the reference substrate 100 may be provided to the first beam splitter 106 along the same optical path as the incident light $L_i$ via the collimator 104. The reflected light $L_r$ may deviate from the optical path of the incident light $L_i$ at the first beam splitter 106 so as to be provided to the spectroscope SP. In this case, the measurement spectrum may be measured by the spectroscope SP.

The controller 522 of FIG. 1 may obtain the measurement spectrum from the spectroscope SP and may store the obtained measurement spectrum in the memory device 524 of FIG. 1. For example, the controller 522 may obtain the measurement spectrum Sm1 or Sm2 illustrated in FIG. 12B from the spectroscope SP.

Referring again to FIGS. 1 and 11, the controller 522 may determine whether a difference between the reference spectrum Sref and the measurement spectrum Sm1 or Sm2 is within an particular, e.g., allowed, range or not (S214). As illustrated in FIG. 12B, if the difference between the reference spectrum Sref and the measurement spectrum Sm1 is within the allowed range, the inspection of the alignment degree of the measurement sensor 540 (S20 of FIG. 4) may be completed (S215). As illustrated in FIG. 12B, if the difference between the reference spectrum Sref and the measurement spectrum Sm2 is beyond the allowed range, the step S10 of FIG. 4 may be restarted to adjust the position of the measurement sensor 540 in the buffer chamber 520 so that the difference between the reference spectrum Sref and the measurement spectrum Sm2 is within the allowed range (S216).

After the inspection of the alignment degree of the measurement sensor 540 (S20 of FIG. 4) is completed, the step S30 to the step S60 of FIG. 4 may be performed.

Figure 13:
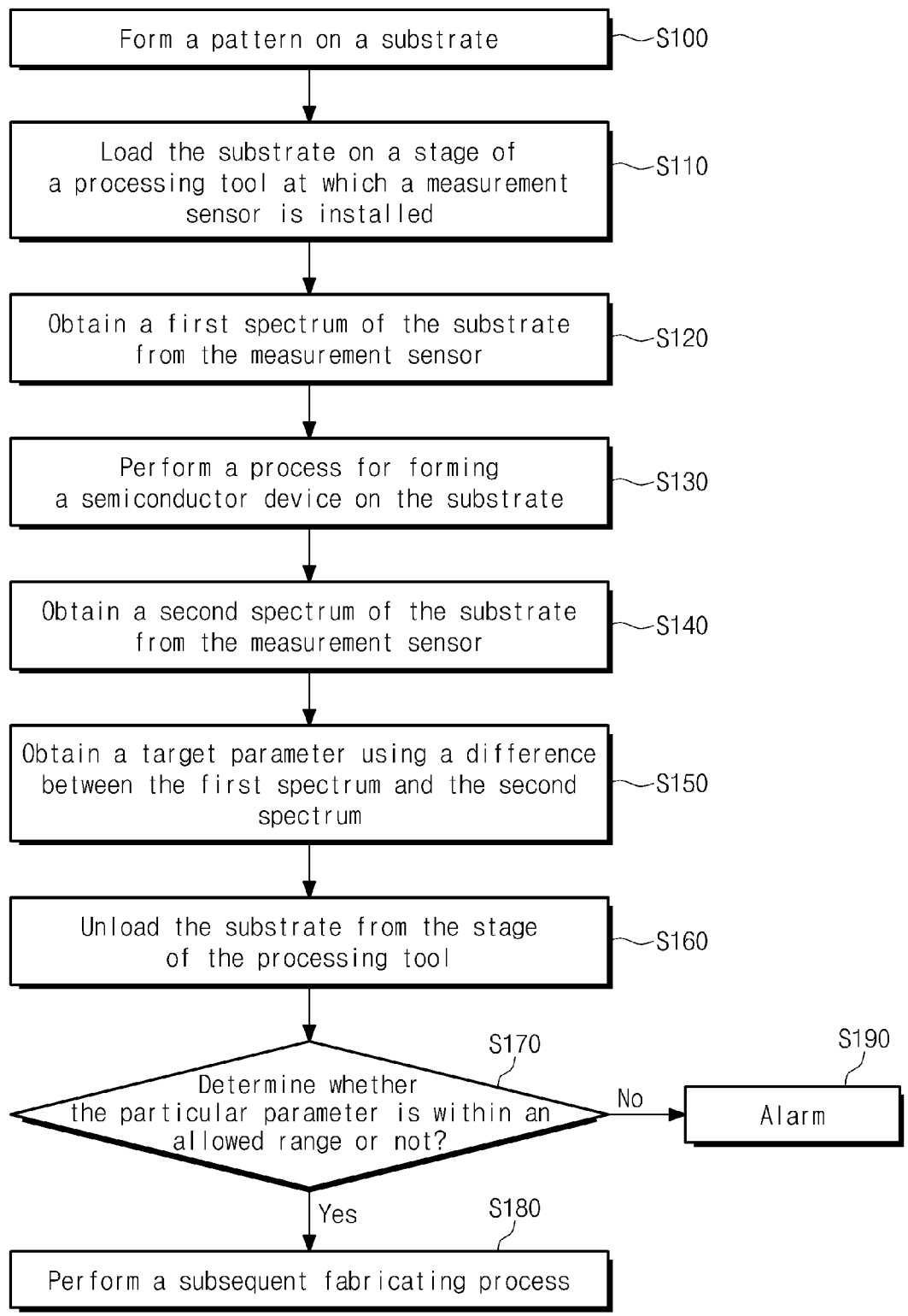
FIG. 13 is a flowchart illustrating a method of fabricating a semiconductor device using a method of measuring a semiconductor device according to example embodiments of the inventive concepts.

FIG. 13 is a flowchart illustrating a method of fabricating a semiconductor device using a method of measuring a semiconductor device according to example embodiments of the inventive concepts.

Referring to FIG. 13, a pattern may be formed on a substrate 100 (S100). In some embodiments, the pattern may include, for example, the plurality of conductive patterns 201 formed on the substrate 100, the capping patterns 203 respectively formed on the conductive patterns 201, and the insulating patterns 205 filling gap regions between the conductive patterns 201 and between the capping patterns 203, as described with reference to FIG. 8A.

Referring to FIGS. 1 and 13, the substrate 100 may be loaded on the stage 512 of the processing tool 530 at which the measurement sensor 540 is installed (S110). In detail, the processing tool 530 may include a manufacturing chamber that includes the processing chamber 510 and the buffer chamber 520, for example, including a door therebetween, and the measurement sensor 540 may be coupled to the buffer chamber 520. Thus, the substrate 100 may be loaded on the stage 512 of the buffer chamber 520, also described as a sensing chamber or measurement chamber.

A first measurement, such as a first spectrum of the substrate 100 may be obtained using the measurement sensor 540 while the substrate 100 is in the buffer chamber 520 (S120). The first spectrum may be obtained as described in the step S41 of FIG. 7. After the first spectrum is obtained, the substrate 100 may be transferred into the processing chamber 510, for example by opening the door and transferring the substrate 100 through the opened door. In one embodiment, during transfer, any remaining gasses or plasma is evacuated from the processing chamber 510 and the processing chamber 510 and buffer chamber 520 are regulated to have the same conditions (e.g., same inert gasses, same vacuum, same pressure, etc.) prior to the door being opened.

A fabrication process for forming a semiconductor device may be performed on the substrate 100 in the processing chamber 510 (S130). In some embodiments, a process of depositing a layer for the formation of the semiconductor device on the substrate 100 may be performed in the processing chamber 510. The process could also include additionally forming a pattern on the layer. Or, the process could include performing a patterning of an existing layer of the substrate, or performing another fabrication process. Thus, as illustrated in the example of FIG. 8B, the insulating layer 209 may be formed on the pattern 207 of the substrate 100. The substrate 100 may be transferred into the buffer chamber 520 after the formation of the insulating layer 209.

A second measurement, such as a second spectrum of the substrate 100 may be obtained using the measurement sensor 540 while the substrate 100 is in the buffer chamber 520 (S140). The second spectrum may be obtained as described in the step S45 of FIG. 7.

The controller 522 connected to the measurement sensor 540 may obtain a value related to a particular parameter by means of a difference between the first spectrum and the second spectrum (S150). In some embodiments, the particular parameter may be a thickness t of the insulating layer 209 formed on the substrate 100. The value associated with the particular parameter may be obtained and compared to a target value or range, for example as described in the step S46 of FIG. 7.

After the second spectrum is obtained, the substrate 100 may be unloaded from the stage 512 of the processing tool 530 (S160). The controller 522 may determine whether the particular parameter is within an allowed, target range or not (S170). If the particular parameter is within the target range, a subsequent fabricating process of the semiconductor device may be performed on the substrate 100 (S180). For example, additional layers or patterns may be formed, the substrate may be singulated into semiconductor chips, may be then packaged into a semiconductor package, etc. If the particular parameter is beyond the target range, an alarm may be generated (S190).

According to certain embodiments of the inventive concepts, the measurement sensor may be coupled to the buffer chamber of the processing tool performing the process of forming the semiconductor device. The buffer chamber may be coupled to a processing chamber, for example, through a door. The measurement sensor may include the measuring unit and the alignment inspecting unit which are provided within the buffer chamber. Thus, in certain embodiments, all mass-production substrates may be inspected before and/or after performing individual processes of forming the semiconductor device. In addition, the alignment degree between the measurement sensor and the mass-production substrate may be monitored using the measuring unit and/or the alignment inspecting unit. Thus, measurement reliability of the semiconductor device may be improved and the semiconductor device with excellent reliability may be fabricated.

Furthermore, since the measurement sensor is coupled to the processing tool, an additional measurement apparatus may not be required.

While certain aspects of the inventive concepts have been described with reference to example embodiments, it will be apparent to those skilled in the art that various changes and modifications may be made without departing from the spirit and scope of the present disclosure. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
   loading a semiconductor substrate on a stage of a sensing chamber of a manufacturing chamber;
   performing a first measurement of the semiconductor substrate using a sensor of the sensing chamber;
   after performing the measurement, transferring the semiconductor substrate directly to a processing chamber of the manufacturing chamber through an opened door disposed between the sensing chamber and the processing chamber, the sensing chamber and the processing chamber abutting each other;
   processing the semiconductor substrate in the processing chamber to form a layer and/or pattern on the semiconductor substrate;
   after the processing, transferring the semiconductor substrate directly back to the sensing chamber of the manufacturing chamber;
   performing a second measurement of the transferred semiconductor substrate using the sensor of the sensing chamber; and
   determining a difference between the first measurement and second measurement, and based on the difference, determining whether a particular parameter resulting from the formation of the layer and/or pattern is satisfied.

2. The method of claim 1, wherein the particular parameter relates to a thickness of the formed layer and/or pattern.

3. The method of claim 1, wherein each of the first measurement and second measurement includes performing a spectral analysis of light reflected by the semiconductor substrate.

4. The method of claim 1, wherein the semiconductor substrate is transferred between the sensing chamber and the processing chamber without being exposed to an outside of the manufacturing chamber.

5. The method of claim 1, wherein the sensing chamber includes:
   a measuring unit configured to receive an incident light from a light source, and to transmit a reflected light reflected from the semiconductor substrate to a spectroscope; and
   an alignment inspecting unit configured to determine whether the semiconductor substrate is aligned properly.

6. The method of claim 5, wherein the measuring unit includes
   a first beam splitter and a collimator having an elliptical shape, and the alignment inspecting unit includes a second beam splitter which is a moveable beam splitter,
   wherein the second beam splitter deviates from an optical path of each of the incident light and the reflected light after determining whether the semiconductor substrate is aligned properly.

7. The method of claim 5, further comprising:
   determining, using the alignment inspecting unit, if the semiconductor substrate is aligned properly, by comparing reflected light reflected from the semiconductor substrate and split by a beam splitter to incident light reflected by a reflection mirror and split by a beam splitter to determine whether the reflected light and incident light are aligned.

8. The method of claim 1, further comprising:
   when the particular parameter resulting from the formed layer and/or pattern is satisfied, performing one or more additional fabrication processes on the semiconductor substrate to form a semiconductor device.

9. The method of claim 8, wherein the one or more addition fabrication processes includes forming at least one more layer and/or pattern on the semiconductor substrate.

10. The method of claim 8, wherein the semiconductor substrate is a semiconductor wafer and forming the semiconductor device includes:
    singulating a semiconductor chip from the wafer.

11. The method of claim 10, further comprising:
    including the semiconductor chip in a module or a semiconductor package.

12. A method, comprising:
    providing a semiconductor substrate in a manufacturing chamber; and
    while the semiconductor substrate is in the manufacturing chamber:
      performing a first measurement of the semiconductor substrate using a sensor of a sensing chamber of the manufacturing chamber,
      directly transferring the semiconductor substrate through an opened door disposed between the sensing chamber and a processing chamber of the manufacturing chamber, the sensing chamber and the processing chamber abutting each other,
      processing the semiconductor substrate in the processing chamber to form at least a first layer on the semiconductor substrate, and
      based on the first measurement, determining whether a particular parameter resulting from the formation of first layer is within a target value or range.

13. The method of claim 12, wherein:
    performing the first measurement of the semiconductor substrate includes:
      prior to forming the first layer, performing a first spectral analysis of the semiconductor substrate using the sensor of the sensing chamber; and
      after forming the first layer, performing a second spectral analysis of the semiconductor substrate using the sensor of the sensing chamber.

14. The method of claim 13 wherein:
    transferring the semiconductor substrate between the sensing chamber and the processing chamber of the manufacturing chamber includes:
    transferring the semiconductor substrate from the sensing chamber to the processing chamber after performing the first spectral analysis and before forming the first layer; and
    transferring the semiconductor substrate to the sensing chamber from the processing chamber after forming the first layer and before performing the second spectral analysis.

15. The method of claim 12, further comprising:
    performing a second measurement of the semiconductor substrate using a sensor of a sensing chamber of the manufacturing chamber after forming the first layer on the semiconductor substrate while the semiconductor substrate is in the manufacturing chamber,
    wherein the performing the first measurement of the semiconductor substrate using a sensor of a sensing chamber of the manufacturing chamber is performed before the forming the first layer on the semiconductor substrate,
    wherein the determining whether the particular parameter resulting from the formation of first layer is within a target value or range comprises determining a difference between the first measurement and second measurement.

16. The method of claim 12, wherein the semiconductor substrate is transferred between the sensing chamber and the processing chamber without being exposed to an outside of the manufacturing chamber.

17. The method of claim 12, further comprising:
    when the particular parameter resulting from the formation of the first layer is within the target value or range, performing one or more additional fabrication processes on the semiconductor substrate to form a semiconductor device.

18. A method, comprising:
    loading a substrate into a sensing chamber;
    while the substrate is in the sensing chamber, performing a first spectral analysis of the substrate;
    transferring the substrate directly between the sensing chamber and a processing chamber through an opened door disposed between the processing chamber and the sensing chamber, the processing chamber abutting the sensing chamber;
    processing the substrate in the processing chamber to form a first layer and/or pattern on the substrate; and
    based on the first spectral analysis, determining whether a parameter resulting from the formation of first layer and/or pattern is satisfied,
    wherein the sensing chamber includes:
      a measuring unit configured to receive an incident light from a light source, and to transmit a reflected light reflected form the substrate to a spectroscope, the first spectral analysis being performed using the measuring unit; and
      an alignment inspecting unit configured to determine whether the substrate is aligned properly before performing the first spectral analysis,
    wherein the alignment inspecting unit includes a movable beam splitter, and the moveable beam splitter deviates from an optical path of each of the incident light and the reflected light after determining whether the substrate is aligned properly.

19. The method of claim 18, further comprising:

performing a second spectral analysis of the substrate after forming the first layer and/or pattern on the substrate, wherein the performing the first spectral analysis of the substrate is performed before the forming the first layer and/or pattern on the substrate, wherein the determining whether the parameter resulting from the formation of first layer and/or pattern is satisfied comprises determining a difference between the first spectral analysis and the second spectral analysis.

* * * * *